(12) United States Patent
Lee et al.

(10) Patent No.: US 9,236,349 B2
(45) Date of Patent: Jan. 12, 2016

(54) SEMICONDUCTOR DEVICE INCLUDING THROUGH VIA STRUCTURES AND REDISTRIBUTION STRUCTURES

(71) Applicant: Samsung Electronics Co., Ltd., Suwon-Si (KR)

(72) Inventors: Kyu-Ha Lee, Yongin-Si (KR); Pil-Kyu Kang, Anyang-Si (KR); Tae-Yeong Kim, Suwon-Si (KR); Ho-Jin Lee, Seoul (KR); Byung-Lyul Park, Seoul (KR); Gil-Heyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 232 days.

(21) Appl. No.: 13/943,828

(22) Filed: Jul. 17, 2013

(65) Prior Publication Data
US 2014/0048952 A1   Feb. 20, 2014

(30) Foreign Application Priority Data

Aug. 20, 2012 (KR) .................. 10-2012-0090952

(51) Int. Cl.
*H01L 23/538* (2006.01)
*H01L 23/485* (2006.01)
*H01L 23/48* (2006.01)
*H01L 23/00* (2006.01)
*H01L 21/683* (2006.01)
*H01L 21/768* (2006.01)
*H01L 23/525* (2006.01)
*H01L 23/532* (2006.01)

(52) U.S. Cl.
CPC ...... *H01L 23/5384* (2013.01); *H01L 21/76898* (2013.01); *H01L 23/481* (2013.01); *H01L 23/485* (2013.01); *H01L 24/00* (2013.01); *H01L 21/6836* (2013.01); *H01L 21/76834* (2013.01); *H01L 23/525* (2013.01); *H01L 23/53238* (2013.01); *H01L 2225/06513* (2013.01); *H01L 2225/06541* (2013.01); *H01L 2924/13091* (2013.01)

(58) Field of Classification Search
CPC .................................................. H01L 23/485
See application file for complete search history.

(56) References Cited

U.S. PATENT DOCUMENTS

| 7,545,027 | B2 | 6/2009 | Chung et al. |
| 7,928,534 | B2 | 4/2011 | Hsu et al. |
| 2006/0017161 | A1 | 1/2006 | Chung et al. |
| 2008/0122078 | A1 | 5/2008 | He et al. |
| 2010/0276787 | A1 | 11/2010 | Yu et al. |
| 2013/0256910 | A1* | 10/2013 | Lee et al. .......... 257/774 |

FOREIGN PATENT DOCUMENTS

| JP | 2007-095894 | 4/2007 |
| KR | 10-0800496 B1 | 1/2008 |

* cited by examiner

*Primary Examiner* — William Harriston
(74) *Attorney, Agent, or Firm* — Myers Bigel Sibley & Sajovec, P.A.

(57) ABSTRACT

Semiconductor device including through via structure and redistribution structures is provided. The semiconductor device may include internal circuits on a first side of a substrate, a through via structure vertically penetrating the substrate to be electrically connected to one of the internal circuits, a redistribution structure on a second side of the substrate and electrically connected to the through via structure, and an insulating layer between the second side of the substrate and the redistribution structure. The redistribution structure may include a redistribution barrier layer and a redistribution metal layer, and the redistribution barrier layer may extend on a bottom surface of the redistribution metal layer and may partially surround a side of the redistribution metal layer.

20 Claims, 29 Drawing Sheets

SEMICONDUCTOR DEVICE INCLUDING THROUGH VIA STRUCTURES AND REDISTRIBUTION STRUCTURES

CROSS-REFERENCE TO RELATED APPLICATION

This U.S. non-provisional patent application claims priority under 35 U.S.C. §119 to Korean Patent Application No. 10-2012-00090952, filed on Aug. 20, 2012, in the Korean Intellectual Property Office, the disclosure of which is hereby incorporated by reference in its entirety.

FIELD

The present disclosure generally relates to the field of electronics, and more particularly semiconductor devices.

BACKGROUND

As integrated circuit devices have been highly integrated, three-dimensional packaging technologies for stacking chips and redistribution structures have been developed. A through via structure is a three-dimensional packaging technology in which a through via hole is formed through a substrate and a via structure is formed therein.

SUMMARY

A semiconductor device may include internal circuits on a first side of a substrate. The semiconductor device may further include a through via structure vertically penetrating the substrate to be electrically connected to one of the internal circuits and a redistribution structure on a second side of the substrate opposite the first side of the substrate and electrically connected to the through via structure. The semiconductor device may also include an insulating layer between the second side of the substrate and the redistribution structure. The redistribution structure may include a redistribution barrier layer and a redistribution metal layer, and the redistribution barrier layer may extend on a bottom surface of the redistribution metal layer and may partially surround a side of the redistribution metal layer.

In various embodiments, the redistribution barrier layer may surround a lower portion of the side of the redistribution metal layer while exposing an upper portion of the side of the redistribution metal layer.

In various embodiments, the insulating layer may include a lower insulating layer in contact with the second side of substrate and an upper insulating layer on the lower insulating layer.

According to various embodiments, the lower insulating layer may be in contact with a side of the through via structure, and the upper insulating layer may be free of contact with the side of the through via structure.

In various embodiments, a vertical portion of the lower insulating layer may extend between the side of the through via structure and the upper insulating layer.

In various embodiments, the lower insulating layer may include silicon oxide and the upper insulating layer may include silicon nitride.

According to various embodiments, a portion of the through via structure may protrude from the second side of the substrate, and the insulating layer may surround the portion of the through via structure.

According to various embodiments, the semiconductor device may further include a passivation layer conformally covering sides and an upper surface of the redistribution structure and an upper surface of the insulating layer.

In various embodiments, the semiconductor device may further include a pad on the passivation layer to be electrically connected to the redistribution structure.

According to various embodiments, the pad may include a pad barrier layer in direct contact with the redistribution structure and a pad metal layer on the pad barrier layer.

According to various embodiments, the through via structure may include a through via core, a through via barrier layer surrounding a side of the through via core and a through via liner surrounding a side of the through via barrier layer. The through via core may be in direct contact with the redistribution structure and the one of the internal circuits.

A semiconductor device may include internal circuits on a first side of a substrate and a through via structure vertically penetrating the substrate to be electrically connected to one of the internal circuits. A portion of the through via structure may protrude from a second side of the substrate opposite the first side of the substrate. The semiconductor device may further include a lower insulating layer on the second side of the substrate, an upper insulating layer on the lower insulating layer and an uppermost insulating layer on the upper insulating layer. The lower insulating layer may surround a side of the portion of the through via structure. The semiconductor device may also include a redistribution structure on the uppermost insulating layer and electrically connected to the through via structure. The redistribution structure may include a redistribution barrier layer in direct contact with the through via structure and a redistribution metal layer on the redistribution barrier layer.

According to various embodiments, the lower insulating layer and the uppermost insulating layer may include silicon oxide and the upper insulating layer may include silicon nitride.

According to various embodiments, the redistribution barrier layer may expose an upper portion of a side of the redistribution metal layer and may surround a lower portion of the side of the redistribution metal layer.

In various embodiments, a vertical portion of the lower insulating layer may extend between the side of the portion of the through via structure and the upper insulating layer, and a vertical portion of the upper insulating layer may extend between the vertical portion of the lower insulating layer and the uppermost insulating layer.

An integrated circuit device may include a redistribution structure on a substrate and an insulating layer extending between the substrate and the redistribution structure. The integrated circuit device may further include a through via structure penetrating through the substrate and the insulating layer. The redistribution structure may include a barrier layer contacting the through via structure and a metal layer on the barrier layer, and a width of the barrier layer may be greater than a width of the metal layer when viewed in cross-section such that the metal layer may be disposed within the barrier layer.

In various embodiments, the barrier layer may contact at least a portion of side of the metal layer.

According to various embodiments, the insulating layer may include a first insulating layer including silicon oxide and a second insulating layer including silicon nitride.

According to various embodiments, the first insulating layer may contact the surface of the substrate and a side of the through via structure.

In various embodiments, the metal layer may include a seed layer contacting the barrier layer and the seed layer may be disposed within the barrier layer when viewed in cross-section.

DETAILED DESCRIPTION

Figure 1A:
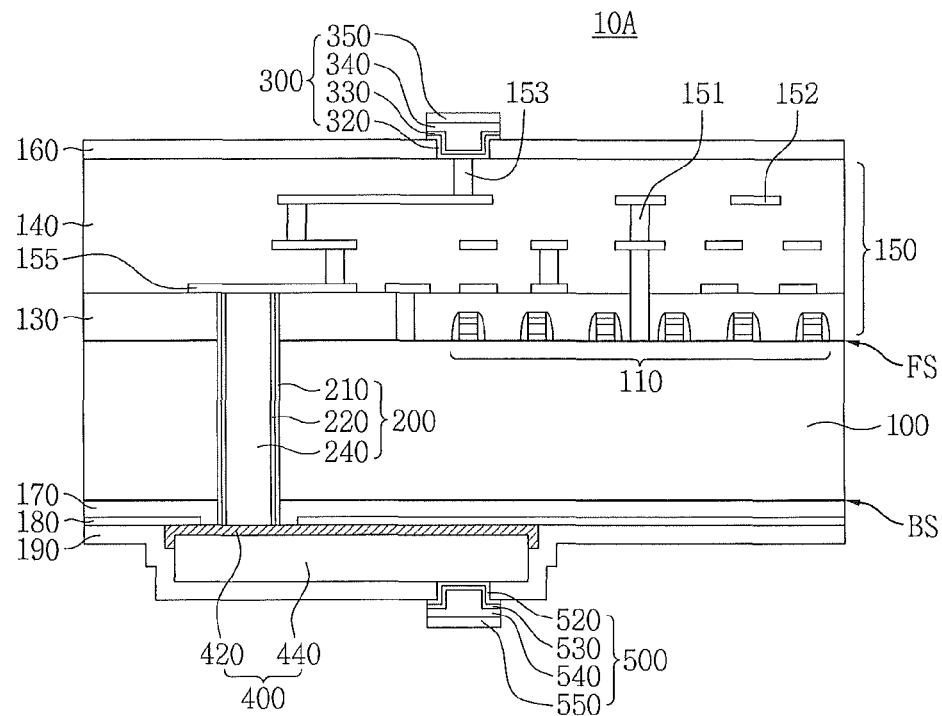
FIGS. 1A to 1I are schematic cross-sectional views of semiconductor devices according to some embodiments of the inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented and the spatially relative descriptors used herein interpreted accordingly.

Also, embodiments of the inventive concept may be described with reference to schematic cross-sectional views or plan views, which are schematic diagrams of idealized example embodiments of the inventive concept. In the drawings, the thickness of layers and regions may be exaggerated for clarity.

Also, embodiments of the inventive concept may be described, with reference to schematic cross-sectional views or plan views, which are schematic diagrams of idealized example embodiments of the inventive concept. As such, variations from the shapes of the illustrations, as a result, for example, of manufacturing techniques and/or tolerances, are to be expected. For example, an etched region illustrated in a right angle may be in the rounded shape or in the shape of having a predetermined curvature. Thus, embodiments of the inventive concept should not be construed as being limited to the particular shapes of regions illustrated herein, but are to include deviations in shapes that result from, e.g., a manufacturing process. Thus, the regions illustrated in the drawings are schematic in nature and are not intended to limit the scope of the inventive concept.

Like reference numerals designate like elements throughout the specification. Therefore, even though identical or similar reference numerals are not described in the corresponding drawing, they may be described with reference to the other drawings. Also, even though no reference numeral is indicated, it may be described with reference to the other drawings.

In the specification, "a front side" and "a back side" are relative concepts used to describe the inventive concept for clarity. Therefore, "the front side" and "the back side" do not refer to a specific direction, position or element and may be compatible with each other. For example, "the front side" may be interpreted as "the back side" or vice versa, Therefore, "the front side" may be expressed as "a first," and "the back side" may be expressed as "a second", or "the front side" may be expressed as "a second," and "the back side" may be expressed as "a first." However, within one embodiment, "the front side" is not interpreted as being the same as "the back side."

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

In the specification, the term "near" refers to that one of two or more elements having symmetrical meanings is located relatively close to another specific element. For example, an expression of "a first end being near to a first side" may be interpreted as "a first end being closer to a first end than to a second end" or "a first end being closer to a first side than to a second side."

FIGS. 1A to 1I are schematic cross-sectional views of semiconductor devices 10A to 10I according to some embodiments of the inventive concept.

Referring to FIG. 1A, a semiconductor device 10A according to one embodiment of the inventive concept may include internal circuits 150 and a front pad 300 formed on a front side (FS) of a substrate 100, a through silicon via (TSV) structure 200 formed in the substrate 100, and a redistribution structure 400 and a back side pad 500 formed on a back side (BS) of the substrate 100.

The substrate 100 may include a silicon wafer. For example, the substrate 100 may be a silicon bulk wafer including a single crystalline silicon wafer, a silicon layer or silicon germanium (SiGe) layer, or a silicon layer on insulator (SOI) including an insulating layer. In some embodiments, the substrate 100 is a single crystalline silicon bulk wafer. The substrate 100 may include several different materials and a "through silicon via (TSV)" structure is sometimes referred to herein as a "through via structure", which are understood as equivalent to one another.

The internal circuits 150 may be formed on FS of the substrate 100. The internal circuits 150 may include unit devices 110, a plurality of internal conductive vias 151 and multi-layered conductive internal interconnections 152. The unit devices 110 may include MOS transistors. The internal conductive vias 151 may be vertically connected to the substrate 100 or internal interconnections 152 to transmit electrical signals. The internal interconnections 152 may horizontally transmit an electrical signal. The internal circuits 150 may include a conductor such as doped silicon, a metal, metal silicide, a metal alloy and a metal compound. The internal circuits 150 may include a front pad via plug 153. The front pad via plug 153 may electrically connect a part of an uppermost internal interconnection 152 to the front pad 300. The front pad via plug 153 may include a metal such as copper, aluminum, tungsten.

The unit devices 110 may be covered with a lower interlayer insulating layer 130. While the lower interlayer insulating layer 130 may be formed as a multi-layer, it is illustrated as a single layer for clarity. The lower interlayer insulating layer 130 may include silicon oxide or silicon nitride. For example, when the lower interlayer insulating layer 130 is formed as a single layer, the lower interlayer insulating layer 130 may include silicon oxide.

The internal circuits 150 may be surrounded by an upper interlayer insulating layer 140. While the upper interlayer insulating layer 140 may be formed as a multi-layer, it is illustrated as a single layer for clarity. The upper interlayer insulating layer 140 may include silicon oxide or silicon nitride.

A front side passivation layer 160 may be formed on the upper interlayer insulating layer 140. The front side passivation layer 160 may include silicon nitride or polyimide.

A front side pad 300 electrically connected to the front pad via plug 153 may be formed on the front side passivation layer 160.

The front side pad 300 may include a front side pad barrier layer 320, a front side pad seed layer 330, a front side pad metal layer 340 and/or a front side pad capping layer 350. The front side pad barrier layer 320 may include a metal for barrier. For example, the front side pad barrier layer 320 may include titanium (Ti), titanium nitride (TiN), titanium tungsten (TiW), tantalum (Ta), tantalum nitride (TaN), tungsten nitride (WN) or other refractory metals. The front side pad seed layer 330 may include metals for seed such as copper (Cu), ruthenium (Ru), nickel (Ni), and tungsten (W). The front side pad metal layer 340 may include metals Cu or Ni. The front side pad barrier layer 320 may be formed as a multi-layer.

The front side pad capping layer 350 may be formed on an upper surface of the front side pad metal layer 340. The front side pad capping layer 350 may cover only the upper surface of the front side pad metal layer 340. The front side pad metal layer 340 may include Cu or Ni. The front side pad capping layer 350 may include gold, silver or Ni.

A through via pad 155 may be formed on an upper part of the front side FS of the substrate 100, e.g., the lower interlayer insulating layer 130. The through via pad 155 may be electrically connected to a part of the internal circuits 150. The through via pad 155 may include metals, metal silicide, a metal alloy, etc. The through via pad 155 may be formed as a multi-layer. For example, the through via pad 155 may include a metal layer for barrier function, and a metal layer for pad function.

The through via structure 200 may penetrate the substrate 100. For example, the through via structure 200 may include a front side end FE facing the front side FS of the substrate 100, and a back side end BE facing the back side BS of the substrate 100. The front side end FE of the through via structure 200 may be disposed close to the front side FS of the substrate 100, and the back side end BE of the through via structure 200 may be disposed close to the back side BS of the substrate 100.

The through via structure 200 may include a through via liner 210, a through via barrier layer 220, and a through via core 240. The through via core 240 may be formed in a pillar shape, and a side of the through via core 240 may be surrounded by the through via barrier layer 220 and the through via liner 210. For example, the through via core 240 may include a metal such as Cu. The through via barrier layer 220 may include metals such as Ti, TiN, TiW, Ta, TaN, WN, or other refractory metals. The through via barrier layer 220 may be formed as a single or multi layer. The through via liner 210 may include an insulating material such as silicon oxide.

The front side end FE of the through via structure 200 may be in contact with the through via pad 155. A through via core 240 may be exposed on the front side end FE of the through via structure 200 to be in direct contact with the through via pad 155.

The back side end BE of the through via structure 200 may protrude more than the surface of the back side BS of the substrate 100. For example, the through via core 240 of the through via structure 200 may protrude more than the back side BS of the substrate 100.

A lower back side insulating layer 170 and an upper back side insulating layer 180 may be formed on the back side BS of the substrate 100. The lower back side insulating layer 170 may be in direct contact with the back side BS of the substrate 100. The lower back side insulating layer 170 may surround a side of the through via structure 200. The lower back side insulating layer 170 may be in direct contact with a side of the through via structure 200, e.g., the through via liner 210. The upper back side insulating layer 180 may be in direct contact with a redistribution structure 400. The upper back side insulating layer 180 may be separated from the through via structure 200 without contact. The lower back side insulating layer 170 may be extended between the through via structure 200 and the upper back side insulating layer 180. For example, the lower back side insulating layer 170 may be interposed between the through via structure 200 and the upper back side insulating layer 180. An upper surface of the lower back side insulating layer 170 and that of the upper back side insulating layer 180 may be flat. The lower back side insulating layer 170 may include silicon oxide, and the upper back side insulating layer 180 may include silicon nitride.

The redistribution structure 400 may be formed on the upper back side insulating layer 180 to be in contact with the through via structure 200. The redistribution structure 400 may include a redistribution barrier layer 420 and a redistribution metal layer 440. The redistribution barrier layer 420 may be in contact with the through via structure 200. The redistribution barrier layer 420 may be in direct contact with the through via barrier layer 220 and/or the through via core 240. The redistribution barrier layer 420 may partially surround bottom and sides of the redistribution metal layer 440. For example, the redistribution barrier layer 420 may surround lower sides of the redistribution metal layer 440 and expose upper parts. The lower sides of the redistribution metal layer 440 may be surrounded by the redistribution barrier layer 420. The upper sides of the redistribution metal layer 440 may be exposed by the redistribution barrier layer 420. Also, the upper end of the redistribution barrier layer 420 may be slightly lower than the upper surface of the redistribution metal layer 440 to surround most of the side of the redistribution metal layer 440 with a part of the uppermost side of the redistribution metal layer 440 exposed. The redistribution barrier layer 420 may include Ti, TiN, TiW, Ta, TaN, WN, or other refractory metals. The redistribution metal layer 440 may include Cu. The redistribution metal layer 440 may include Ni or gold on its surface.

A back side passivation layer 190 may be formed to surround the side and upper surfaces of the redistribution structure 400. The back side passivation layer 190 may be in contact with the upper back side insulating layer 180, sides of the redistribution barrier layer 420 and the side and upper surfaces of the redistribution metal layer 440. The back side passivation layer 190 may be conformally formed to be along the upper back side insulating layer 180, the redistribution barrier layer 420 and a surface profile of the redistribution metal layer 440. The back side passivation layer 190 may expose a part of the upper surface of the redistribution metal layer 440. For example, the back side passivation layer 190 may include silicon nitride.

A back side pad 500 electrically connected to the redistribution structure 400 may be formed on the back side passivation layer 190.

The back side pad 500 may include a back side pad barrier layer 520, a back side pad seed layer 530, a back side pad metal layer 540 and/or a back side pad capping layer 550. The back side pad barrier layer 520 may include metals for barrier. For example, the back side pad barrier layer 520 may include Ti, TiN, TiW, Ta, TaN, WN, or other refractory metals. The back side pad seed layer 530 may include metals for seed such as copper (Cu), ruthenium (Ru), nickel (Ni), and tungsten (W). The back side pad metal layer 540 may include a metal such as Cu or Ni. The back side pad barrier layer 520 may be formed as a multi-layer.

The back side pad capping layer 550 may be formed on a surface of the back side pad metal layer 540. The back side pad metal layer 540 may include, for example, Cu or Ni. The back side pad capping layer 550 may include, for example, gold, silver or Ni.

The front side pad 300 may be vertically aligned with the back side pad 500.

Figure 1B:
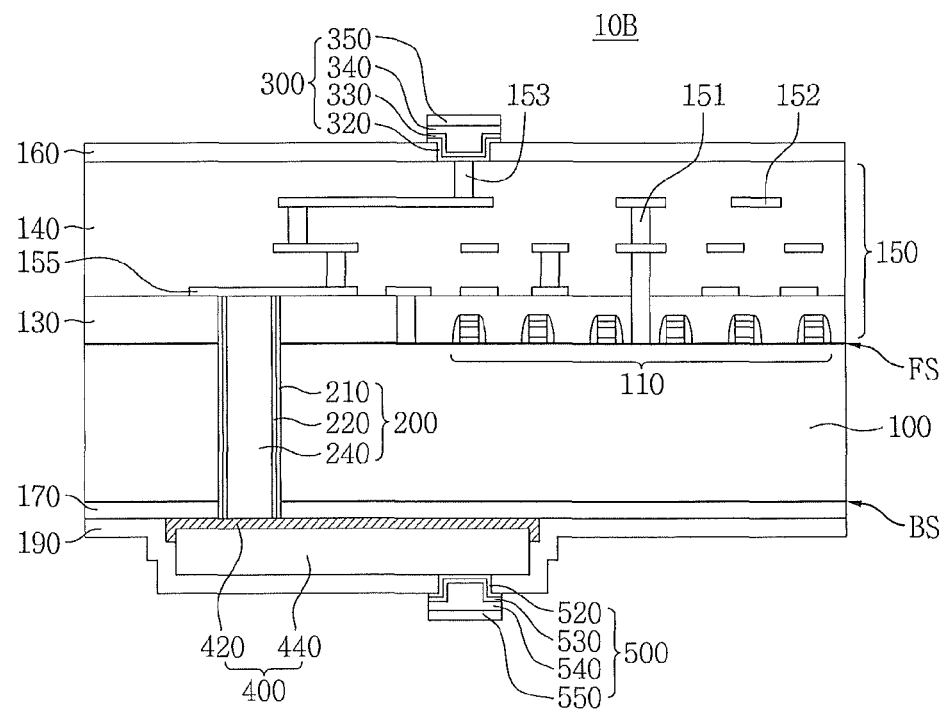

Referring to FIG. 1B, a semiconductor device 10B according to some embodiments of the inventive concept may include a single-layered back side insulating layer 170 on the back side BS of the substrate 100 and a redistribution structure 400 directly formed on the back side insulating layer 170. The single-layered back side insulating layer 170 may include, for example, silicon oxide.

Figure 1C:
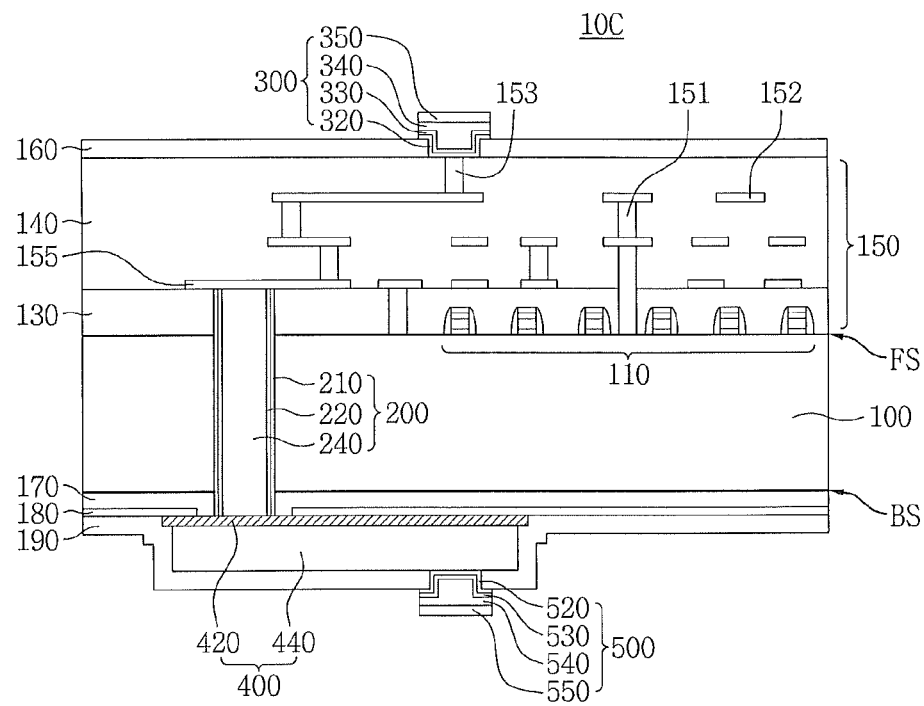

Referring to FIG. 1C, a semiconductor device 10C according to some embodiments of the inventive concept may include a redistribution structure 400 having a redistribution barrier layer 420 sufficiently exposing sides of a redistribution metal layer 440. For example, the redistribution barrier layer 420 may expose 90% of the side of the redistribution metal layer 440 or more. Alternatively, as shown in the drawing, the redistribution barrier layer 420 may completely expose the sides of the redistribution metal layer 440. A side end of the redistribution barrier layer 420 may horizontally protrude more than the sides of the redistribution metal layer 440.

Figure 1D:
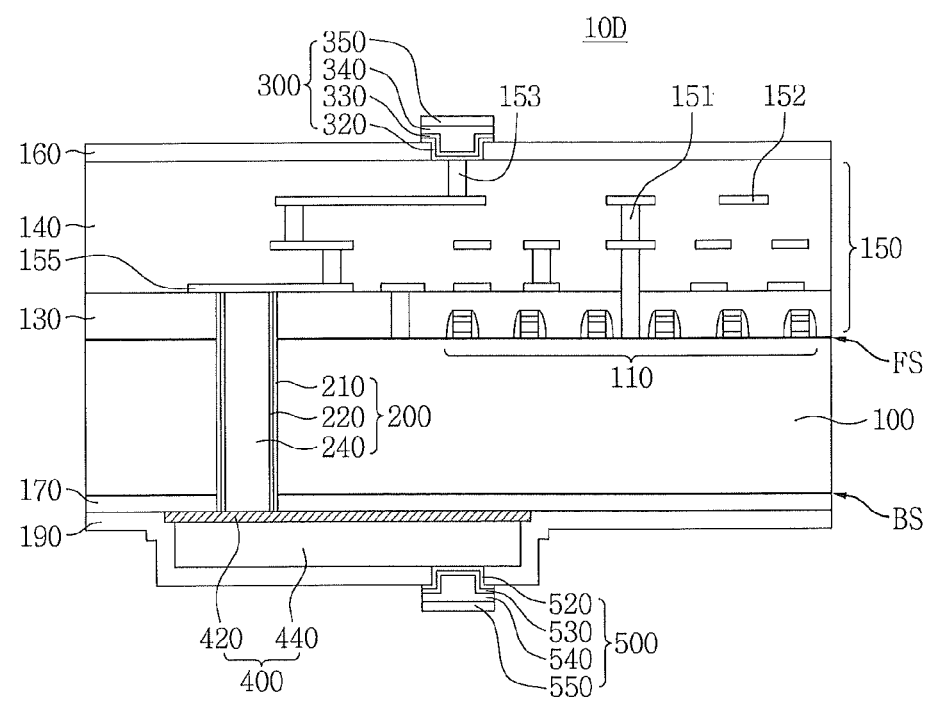

Referring to FIG. 1D, a semiconductor device 10D according to some embodiments of the inventive concept may include a single-layered back side insulating layer 170 on a back side BS of a substrate 100 and a redistribution structure 400 having a redistribution barrier layer 420 directly formed on the back side insulating layer 170 and fully exposing sides of the redistribution metal layer 440.

Figure 1E:
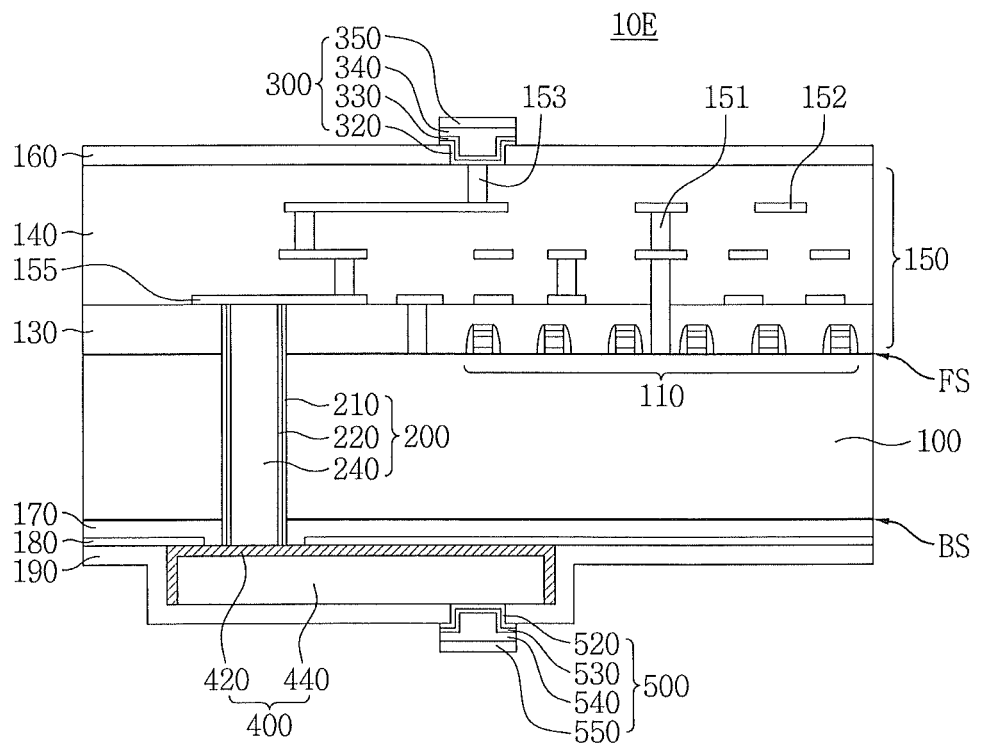

Referring to FIG. 1E, a semiconductor device 10E according to some embodiments of the inventive concept may include a redistribution structure 400 having a redistribution barrier layer 420 completely covering sides of the redistribution metal layer 440. For example, an upper end of the redistribution barrier layer 420 and an upper surface of the redistribution metal layer 440 may be disposed at an equal level.

Figure 1F:
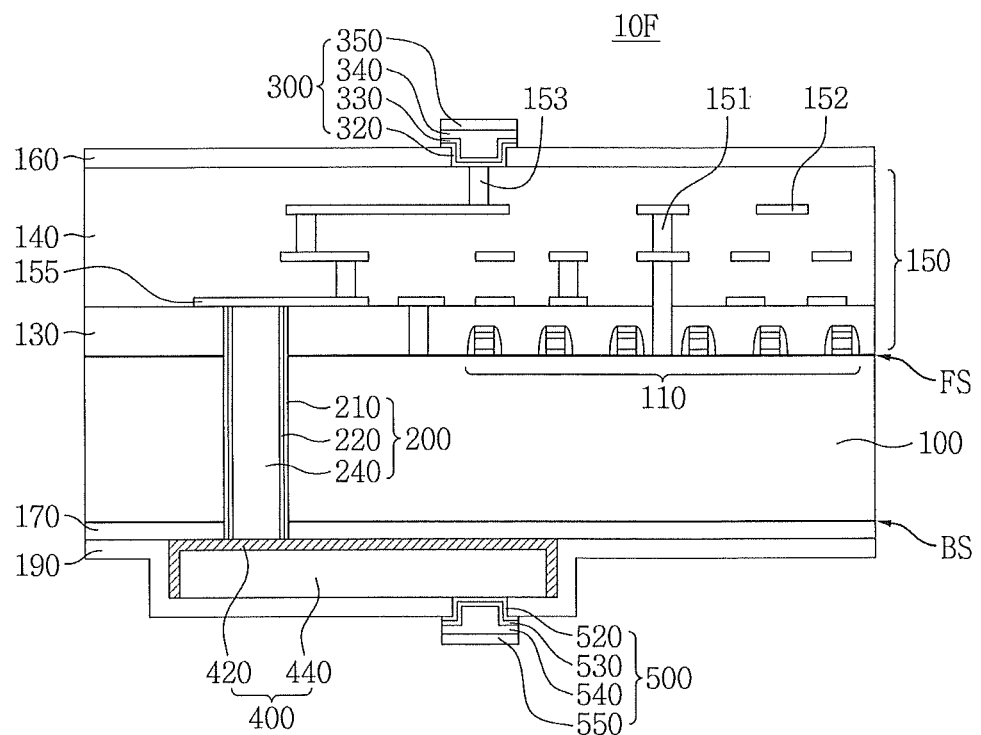

Referring to FIG. 1F, a semiconductor device 10F according to some embodiments of the inventive concept may include a single-layered back side insulating layer 170 on the back side BS of a substrate 100 and a redistribution structure 400 having a redistribution barrier layer 420 directly formed on the back side insulating layer 170 and completely surrounding sides of a redistribution metal layer 440.

Figure 1G:
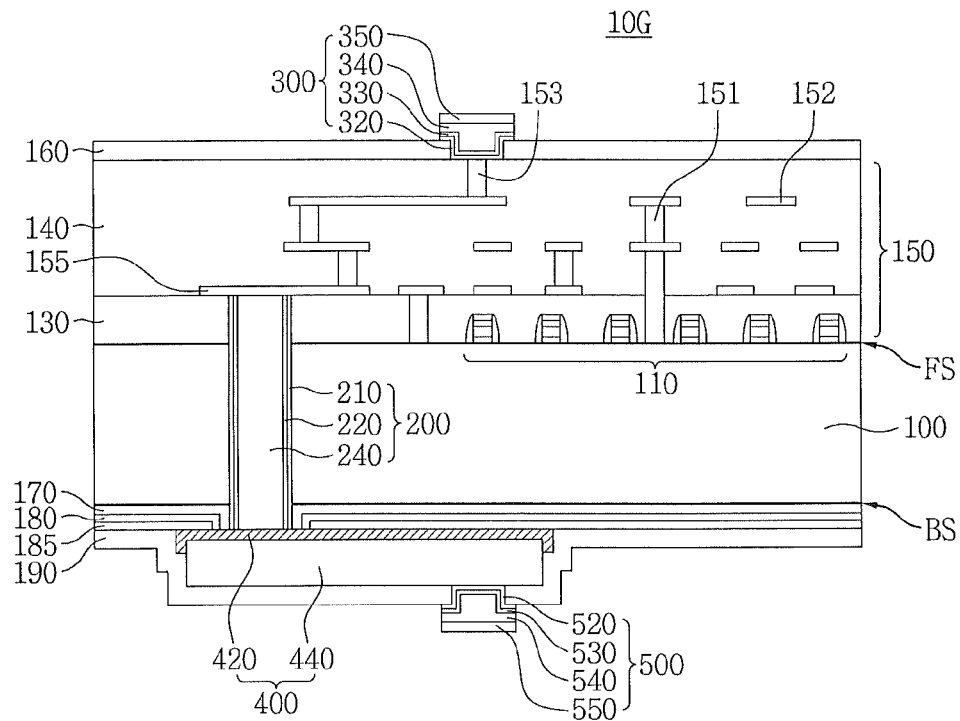

Referring to FIG. 1G, a semiconductor device 10G according to some embodiments of the inventive concept may include a lower back side insulating layer 170 formed on a back side BS of a substrate 100, an upper back side insulating layer 180, an uppermost back side insulating layer 185 and a redistribution structure 400. The lower back side insulating layer 170 may be in direct contact with a back side BS of the substrate 100. The lower back side insulating layer 170 may surround a side of a through via structure 200. The lower back side insulating layer 170 may be in direct contact with a side of the through via structure 200, e.g., a through via liner 210. The upper back side insulating layer 180 may be in direct contact with the redistribution structure 400. The upper back side insulating layer 180 may be free of contact with the through via structure 200. A vertical portion of the lower back side insulating layer 170 may be extended between the through via structure 200 and the upper back side insulating layer 180. A vertical portion of the upper back side insulating layer 180 may be extended between the through via structure 200 and the uppermost back side insulating layer 185. An upper surface of the lower back side insulating layer 170, that of the upper back side insulating layer 180 and that of the uppermost back side insulating layer 185 may be flat. The lower back side insulating layer 170 and the upper back side insulating layer 180 may be in partial contact with the redistribution structure 400 to surround around the through via structure 200, and the uppermost back side insulating layer 185 may be in contact with a sufficient area of the redistribution structure 400. The lower back side insulating layer 170 may include, for example, silicon oxide, the upper back side insulating layer 180 may include, for example, silicon nitride, and the uppermost back side insulating layer 185 may include, for example, silicon oxide. The redistribution structure 400 may be understood with reference to FIG. 1A and the descriptions thereof.

Figure 1H:
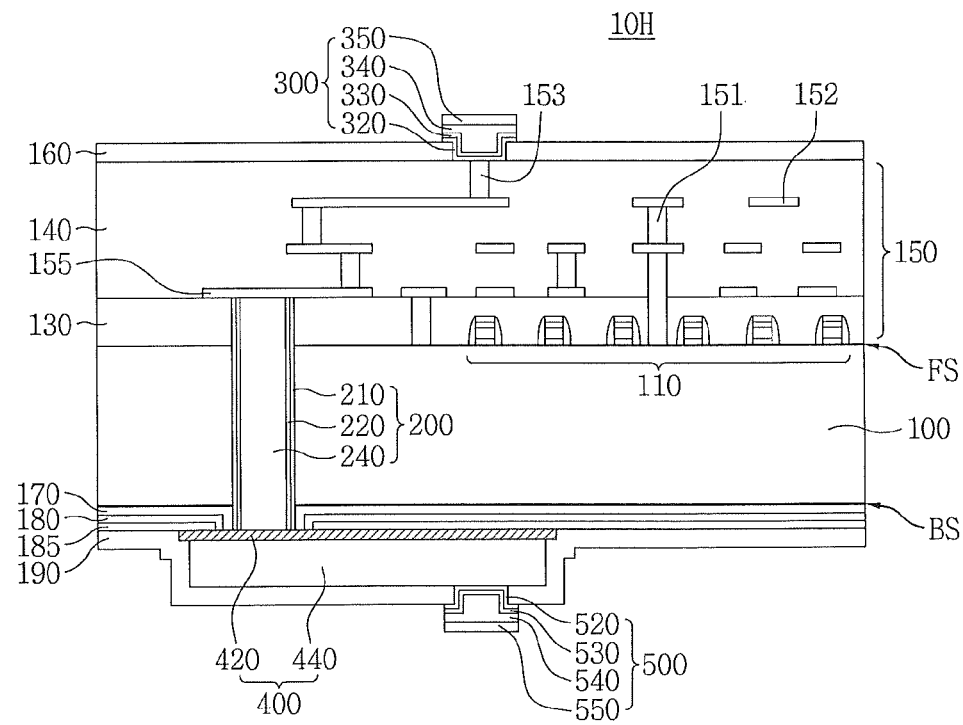

Referring to FIG. 1H, a semiconductor device 10H according to some embodiments of the inventive concept may be understood with reference to FIGS. 1C and 1G.

Figure 1I:
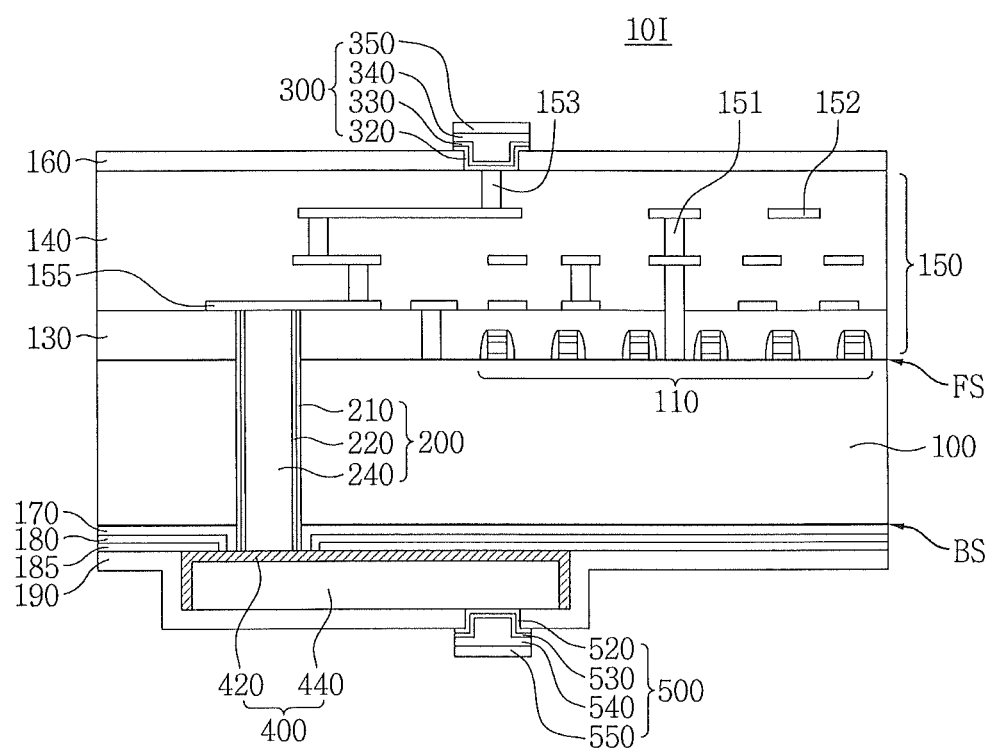

Referring to FIG. 1I, a semiconductor device 10I according to some embodiments of the inventive concept may be understood with reference to FIGS. 1E and 1G.

The semiconductor devices according to some embodiments may not include an undercut or empty space between the back side insulating layers 170, 175 and 180 and the redistribution metal layer 440, and thus the redistribution metal layer 440 may be physically and mechanically stable. The semiconductor devices 10A to 10I according to some embodiments have the redistribution metal layer 440 protruding from the back side insulating layers 170, 175 and 180, and thus when the back side pad 500 is physically or electrically connected to or combined with other components, connection and combination may be stable.

The semiconductor devices according to some embodiments may have the redistribution metal layer 440, the lower part of which is completely surrounded by the redistribution barrier layer 420, and thus the redistribution structure 400 may exhibit physical and mechanical stress-resistance based on stable shape and position. Therefore, a process of forming the back side passivation layer 190 by using a process of depositing a densified material such as silicon nitride may be performed. For example, when the redistribution structure 400 is not physically stable, the redistribution structure 400 may be lifted, cut or moved during subsequent depositing processes.

The semiconductor devices according to some embodiments of the inventive concept may have the redistribution structure protruding from the back side of the substrate or an upper surface of the back side insulating layer, so that a bonding process using, for example, a bump may be facilitated, and the bonding structure and electrical characteristics may be stable.

FIGS. 2A to 2K are cross-sectional views illustrating a method of forming a through via structure 200 and a front pad 300 of semiconductor devices 10A to 10I according to some embodiments of the inventive concept.

Figure 2A:
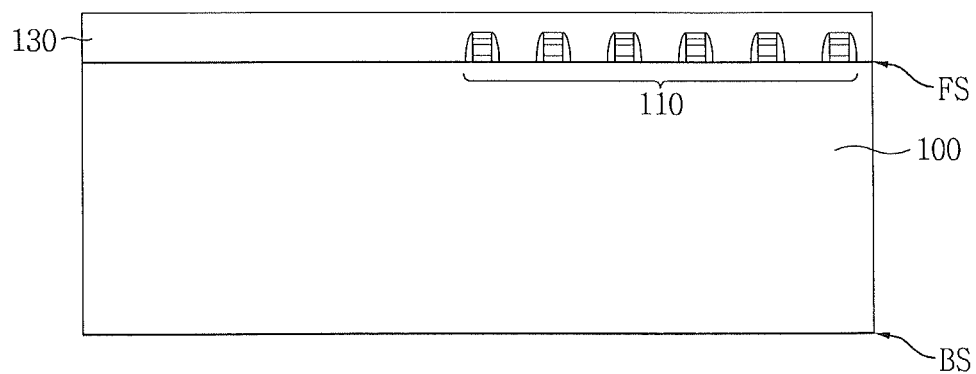
FIGS. 2A to 2K are cross-sectional views illustrating a method of forming a through via structure and a front pad of semiconductor devices according to some embodiments of the inventive concept.

Referring to FIG. 2A, a method of forming a semiconductor device according to some embodiments of the inventive concept may include forming unit devices 110 on a front side FS of a substrate 100. The unit devices 110 may include MOS transistors. Then, the method may include forming a lower interlayer insulating layer 130 covering the unit devices 110 on the front side FS of the substrate 100. The lower interlayer insulating layer 130 may include, e.g., silicon oxide.

Figure 2B:
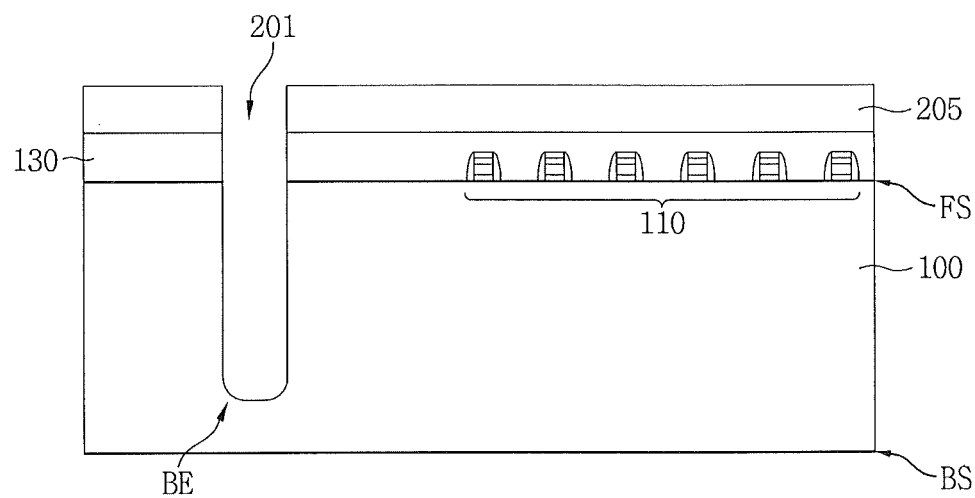

Referring to FIG. 2B, the method may include forming a through via hole 201 in the substrate 100. The formation of the through via hole 201 may include forming a through via hole mask pattern 205 on the lower interlayer insulating layer 130, and etching the substrate 100 using a through via hole mask pattern 205 as an etch mask. The through via hole mask pattern 205 may include, for example, silicon nitride, silicon oxynitride or an organic material such as photoresist. A bottommost end BE of the through via hole 201 may be disposed in the substrate 100, e.g., bulk. The through via hole 201 may not completely penetrate a back side BS of the substrate 100. After forming the through via hole 201, the through via hole mask pattern 205 may be removed.

Figure 2C:
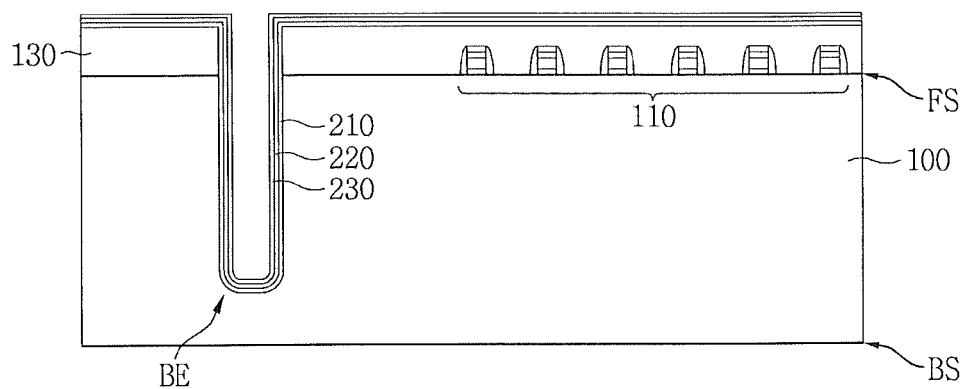

Referring to FIG. 2C, the method may include conformally forming a through via liner 210, a through via barrier layer 220 and a through via seed layer 230 on an inner wall of the through via hole 201. The through via liner 210 may include, for example, silicon oxide or silicon nitride. For example, the through via liner 210 may be deposited using an atomic layered deposition (ALD) process, a plasma enhanced chemical vapor deposition (PECVD) process or a sub-atmosphere chemical vapor deposition (SACVD) process. Alternatively, the through via liner 210 may be formed by performing thermal oxidation on the inner wall of the through via hole 201 using a thermal oxidation process. In some embodiments, it is assumed and illustrated that the through via liner 210 includes a silicon oxide layer formed using the SACVD. The formation of the through via barrier layer 220 may include conformally forming a metal for barrier on the through via liner 210 using a physical vapor deposition (PVD) process such as sputtering, or a metal organic chemical vapor deposition (MOCVD) process. The through via barrier layer 220 may include, for example, Ti, TiN, TiW, Ta, TaN, WN, or other refractory metals. The through via barrier layer 220 may be formed as a single or multi-layer. The formation of the through via seed layer 230 may include conformally forming metals for seed such as Cu, Ru, Ni and W on the through via barrier layer 220 using a PVD or CVD process.

Figure 2D:
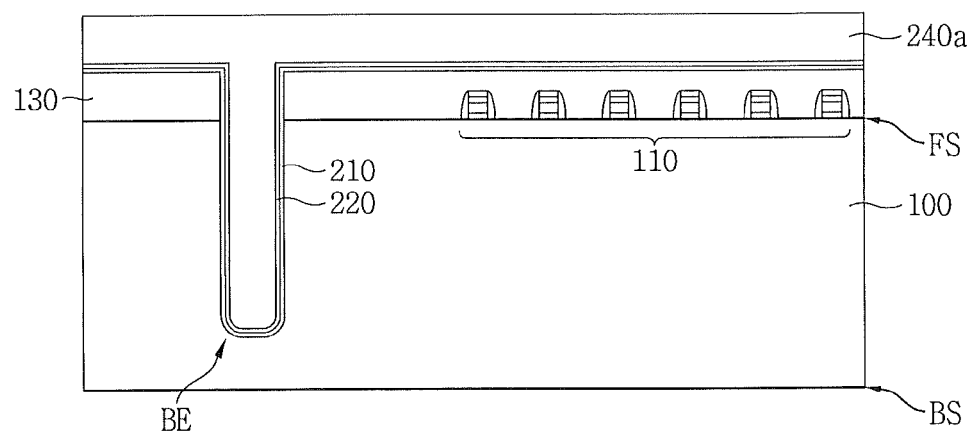

Referring to FIG. 2D, the method may include forming a through via core material layer 240a filling a through via hole 201. The through via core material layer 240a may be formed using a plating process. When the through via seed layer 230 is formed as the same material as the through via core material layer 240a, a boundary between the through via seed layer 230 and the through via core material layer 240a may be not visible. For example, when both the through via seed layer 230 and the through via core material layer 240a include Cu, a boundary therebetween may be not visible. Therefore, the through via seed layer 230 is omitted in the drawing.

Figure 2E:
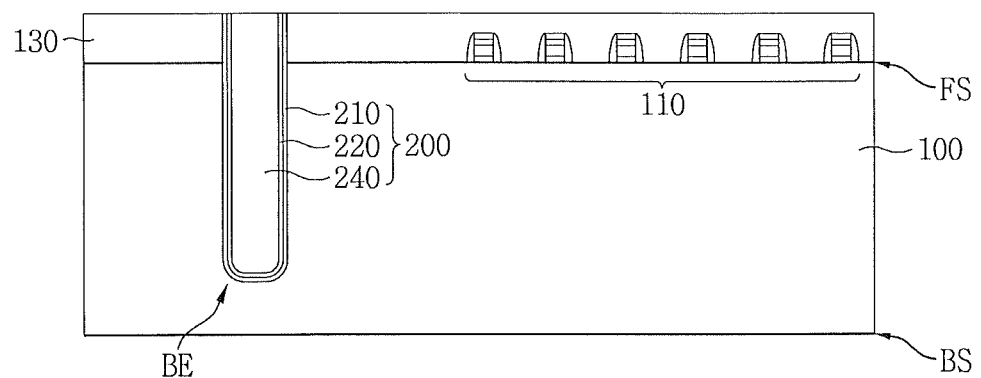

Referring to FIG. 2E, the method may include forming a through via structure 200. The through via structure 200 may include a through via core 240, a through via barrier layer 220 and a through via liner 210. The formation of the through via structure 200 may include planarizing and removing the through via core material layer 240a, the through via seed layer 230, the through via barrier layer 220 and the through via liner 210 on an upper surface of the lower interlayer insulating layer 130 by a chemical mechanical polishing process. For example, the through via core material layer 240a and the through via seed layer 230 may be removed using a first chemical mechanical polishing process, the through via barrier layer 220 may be removed using a second chemical mechanical polishing process, and the through via liner 210 may be removed using a wet etching or cleaning process. Alternatively, the method may include removing the through via core material layer 240a and the through via seed layer 230 using a chemical mechanical polishing process, and removing the through via barrier layer 220 and/or the through via liner 210 using a wet etching or cleaning process.

Figure 2F:
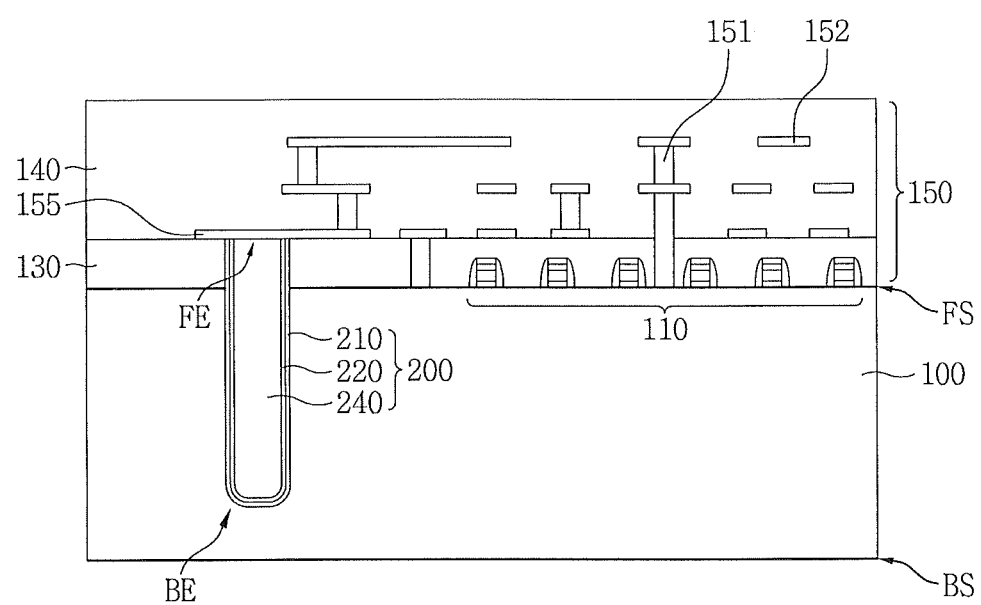

Referring to FIG. 2F, the method may include forming internal circuits 150 on the front side FS of the substrate 100. The internal circuits 150 may include a plurality of conductive inner vias 151 and a plurality of conductive inner wires 152.

The process may include forming a lower interlayer insulating layer 130 and an upper interlayer insulating layer 140 covering the internal circuits 150. A through via pad 155 may be formed in the upper interlayer insulating layer 140 to be in contact with a front side end FE of the through via structure 200. For example, the through via pad 155 may be formed on the lower interlayer insulating layer 130. The through via pad 155 may include a metal. The upper interlayer insulating layers 140 are formed as a multi-layer.

Figure 2G:
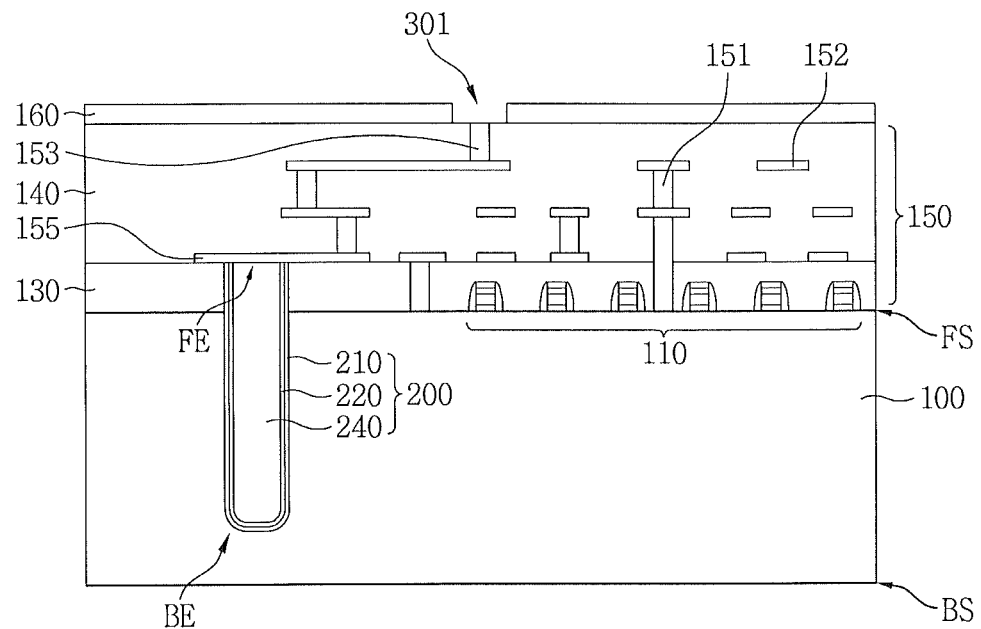

Referring to FIG. 2G, the method may include forming a front side pad via plug 153 and a front side passivation layer 160 on the upper interlayer insulating layer 140. The front side pad via plug 153 may include a metal. For example, the front side pad via plug 153 may include an uppermost metal layer. The front side passivation layer 160 may include silicon nitride, silicon oxide or polyimide. The front side passivation layer 160 may include a lower opening 301 exposing an upper part of the front side pad via plug 153.

Figure 2H:
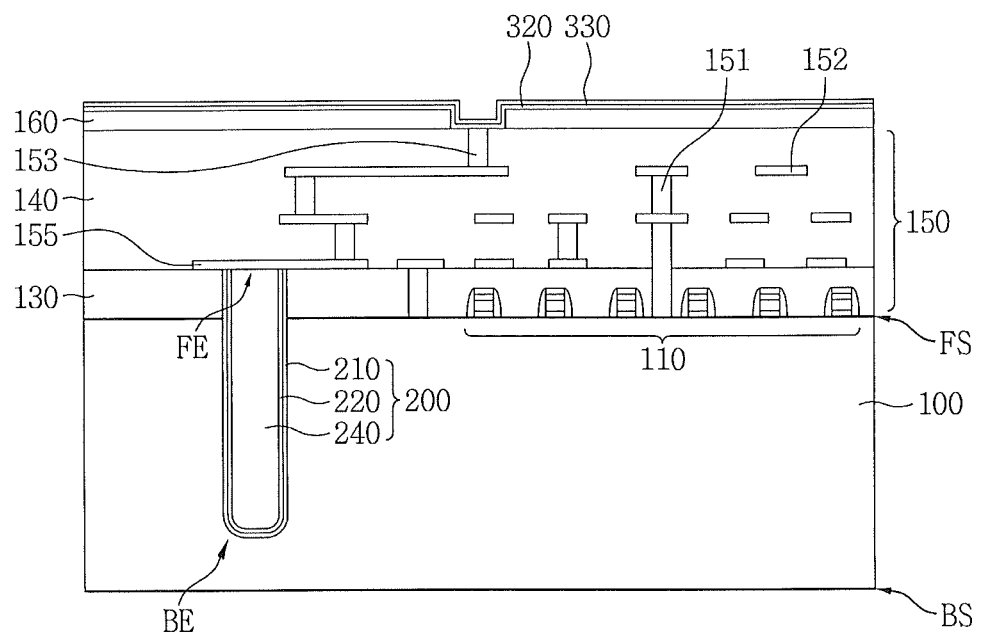

Referring to FIG. 2H, the method may include forming a front side pad barrier layer 320 and a front side pad seed layer 330 in the lower opening 301 and on the front side passivation layer 160. The formation of the front side pad barrier layer 320 may include conformally forming a metal on the front side passivation layer 160 using a PVD or MOCVD process. The front side pad barrier layer 320 may include Ti, TiN, TiW, Ta, TaN, WN, or other refractory metals. The front side pad barrier layer 320 may be formed as a single or multi-layer. The formation of the front side pad seed layer 330 may include conformally forming a metal such as Cu, Ru, Ni, and W on the front side pad barrier layer 320 using a PVD process such as sputtering, or a CVD process.

Figure 2I:
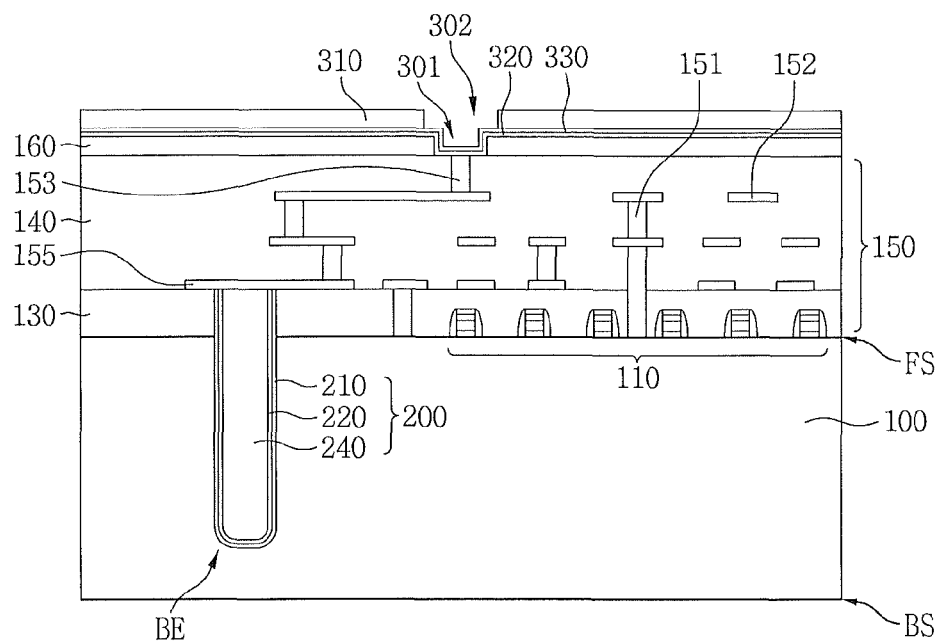

Referring to FIG. 2I, the method may include forming a front side pad mask pattern 310 on the front side pad seed layer 330. The front side pad mask pattern 310 may have an upper opening 302 aligned with the lower opening 301. The front side pad mask pattern 310 may include a photoresist pattern.

Figure 2J:
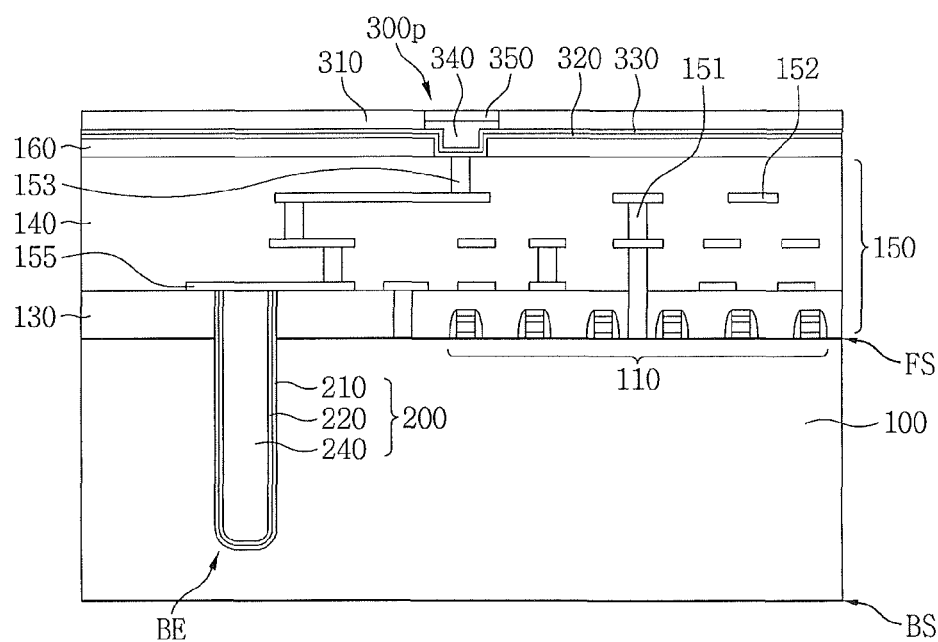

Referring to FIG. 2J, the method may include forming a front side pad 300p. The formation of the front side pad 300p may include forming a front side pad metal layer 340 and a front side pad capping layer 350 in the lower opening 301 and the upper opening 302. The formation of the front side pad metal layer 340 may include forming a metal such as Ni or W using a plating process. The formation of the front side pad capping layer 350 may include plating gold (Au), nickel (Ni) or silver (Ag) on the front side pad metal layer 340.

Figure 2K:
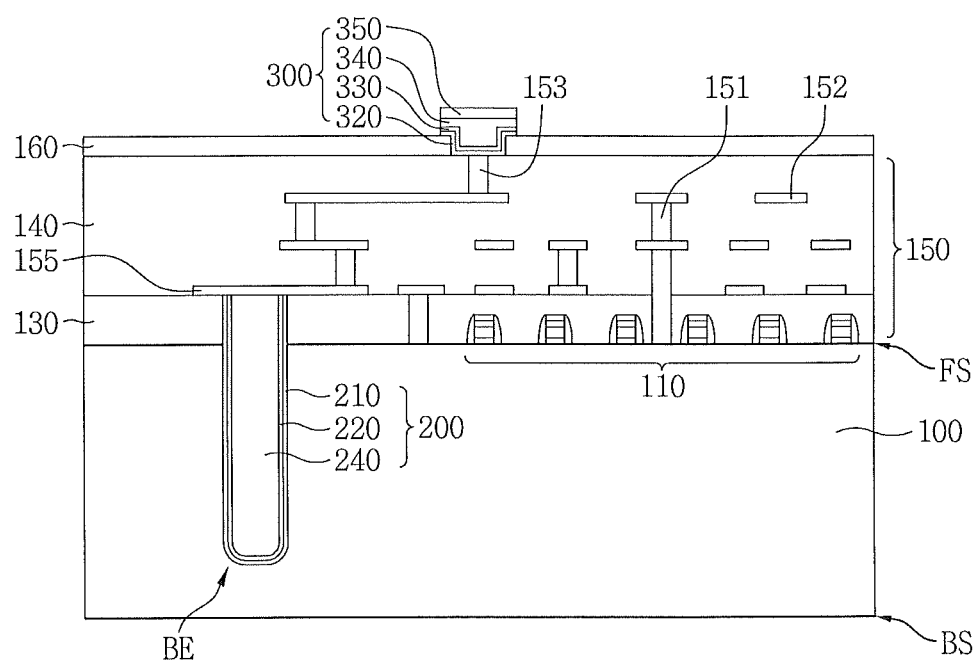

Referring to FIG. 2K, the method may include forming a front side pad 300. The formation of the front side pad 300 may include removing the front side pad mask pattern 310, and partially removing the front side pad seed layer 330 and the front side pad barrier layer 320 exposed on the front side passivation layer 160 using a wet etching process. The removal of the front side pad seed layer 330 may include performing a wet etching process using a chemical solution including a hydrogen peroxide solution, citric acid and water. The removal of the front side pad barrier layer 320 may include performing a wet etching process using a chemical solution including a hydrogen peroxide, potassium hydroxide (KOH), and water.

Figure 3A:
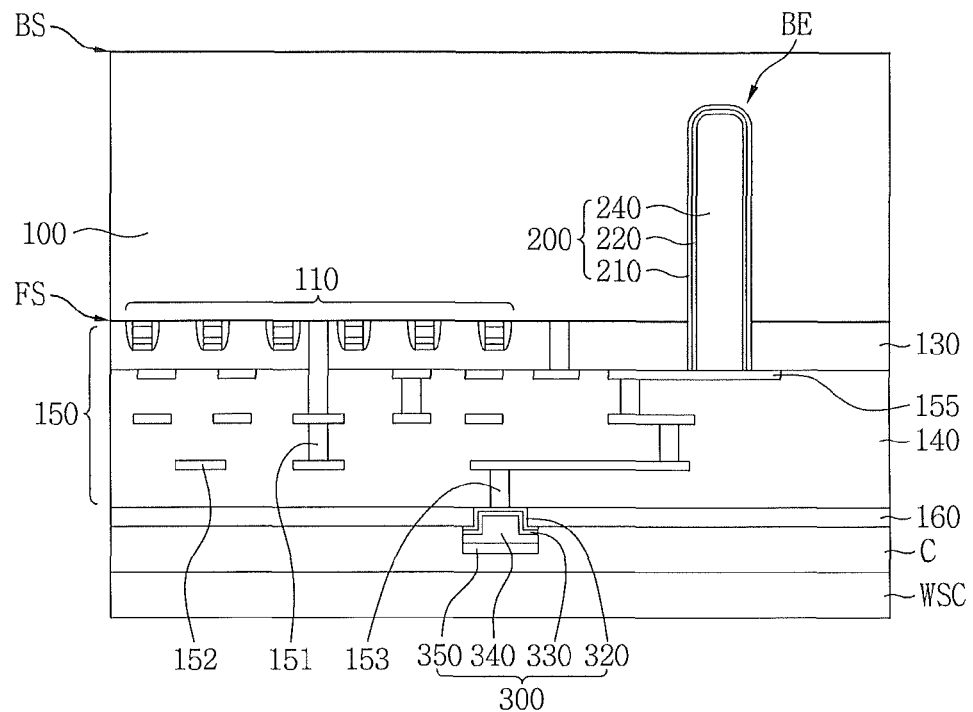
FIGS. 3A to 3N are cross-sectional views illustrating a method of forming a redistribution structure of semiconductor devices according to some embodiments of the inventive concept.
Figure 3B:
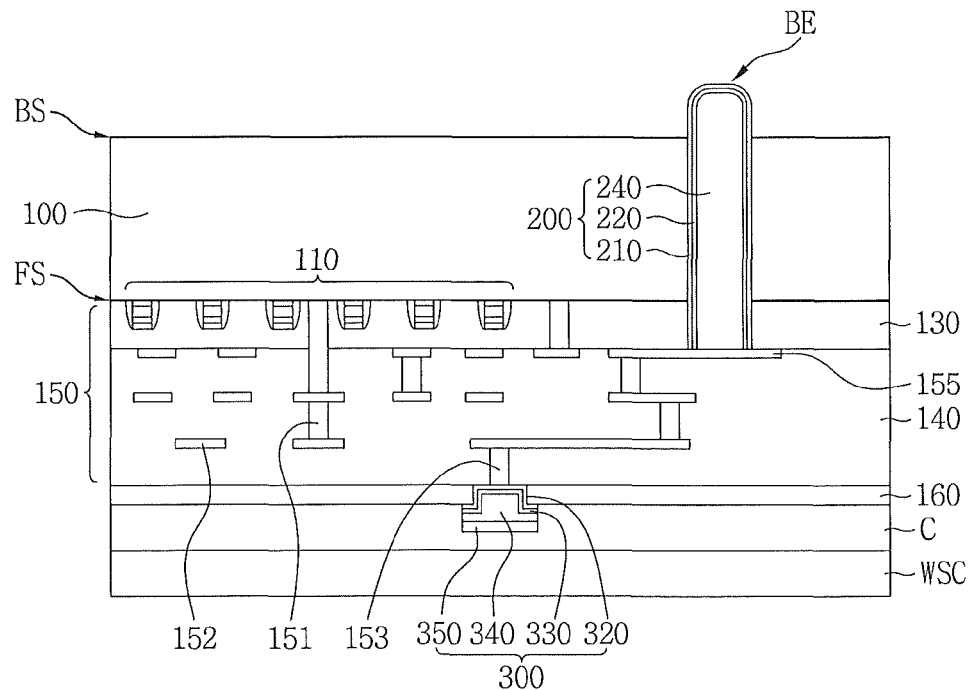
Figure 3C:
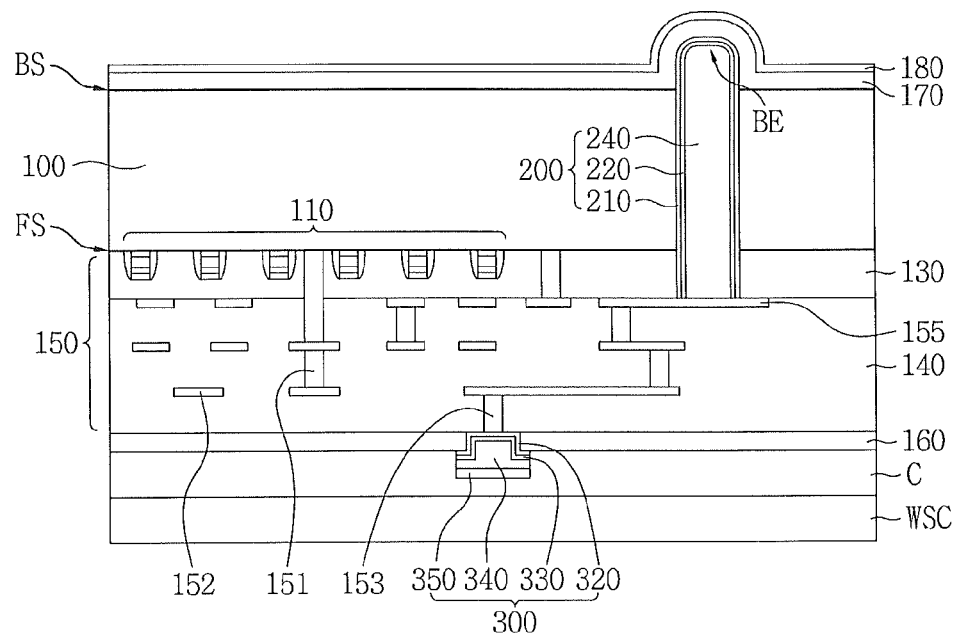
Figure 3D:
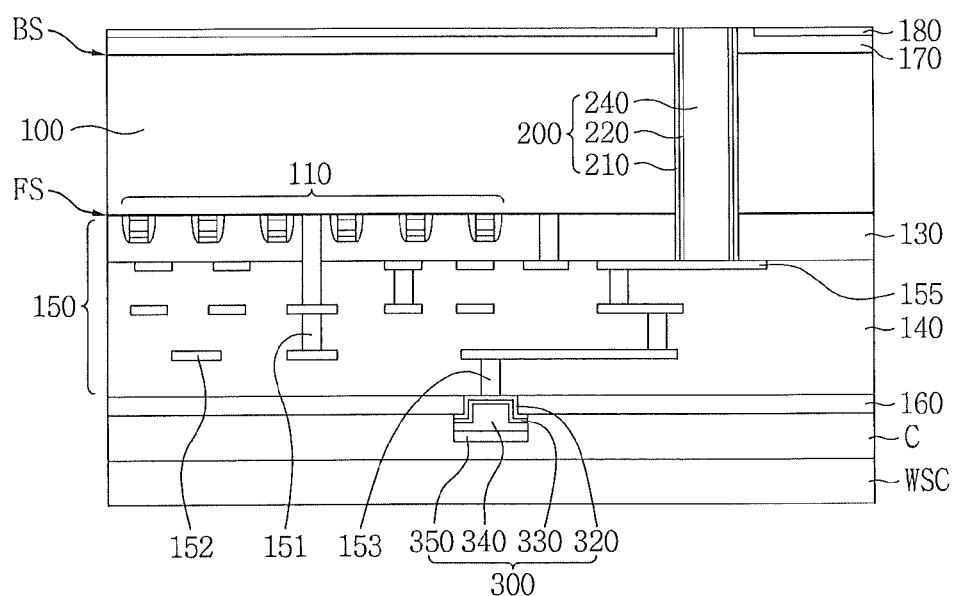
Figure 3E:
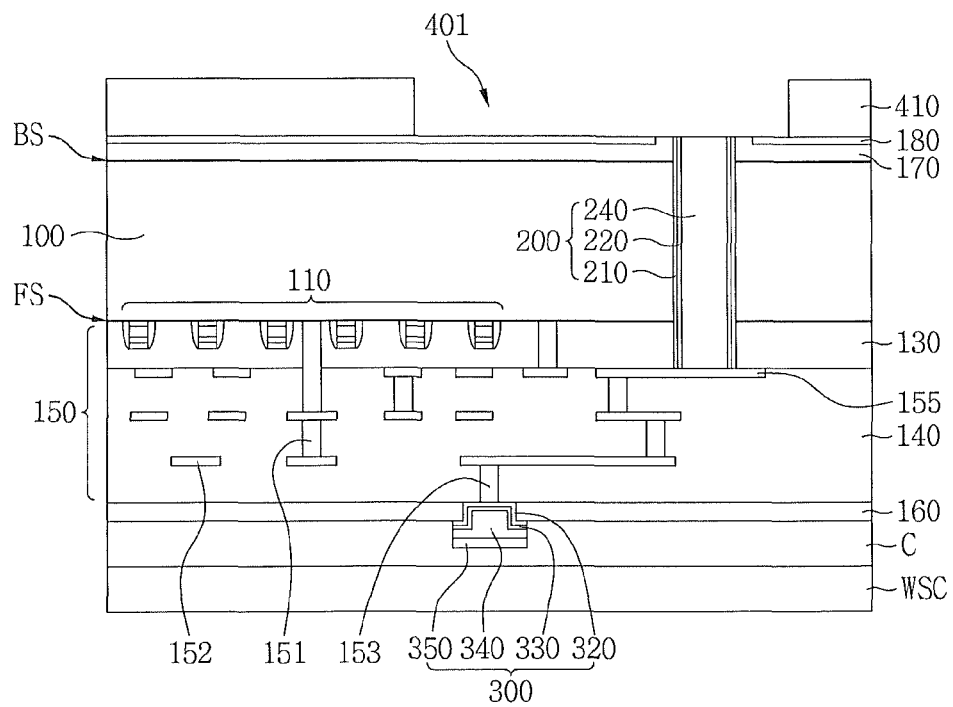
Figure 3F:
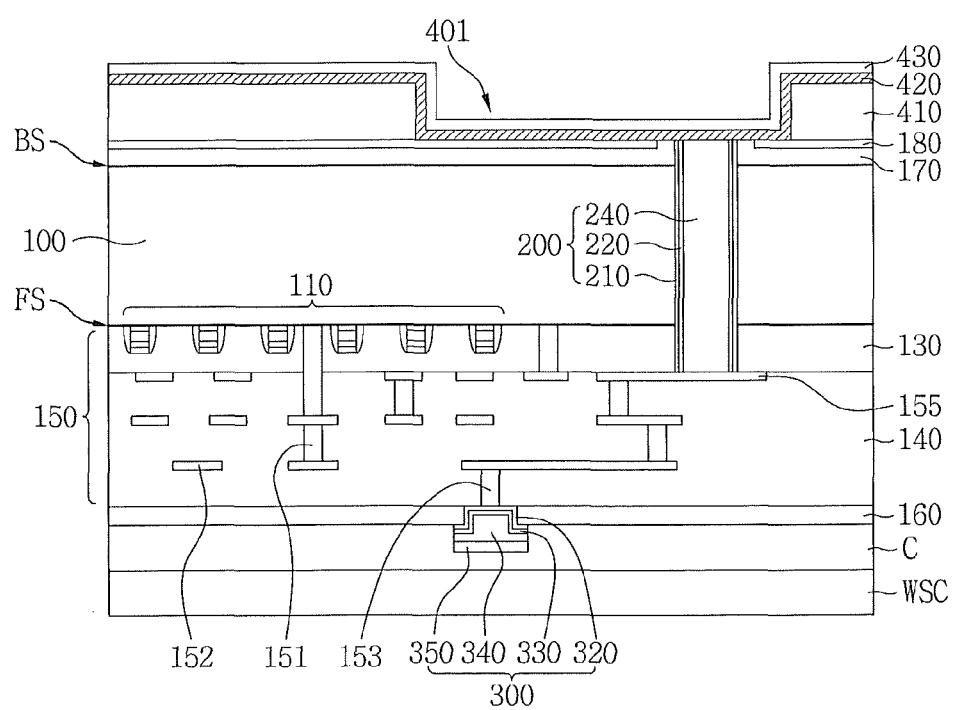
Figure 3G:
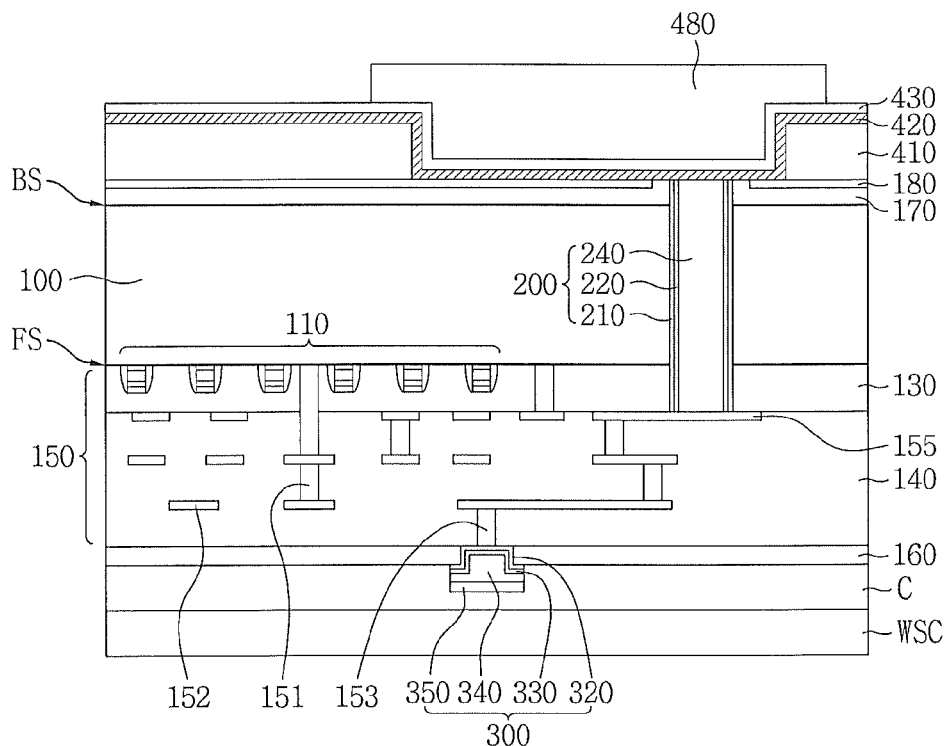
Figure 3H:
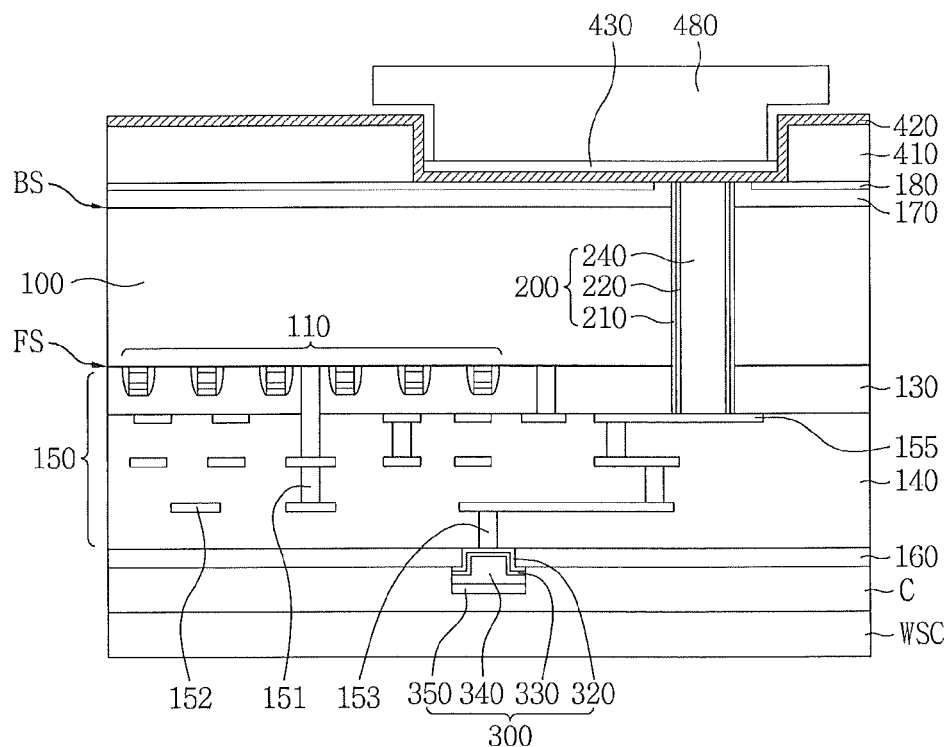
Figure 3I:
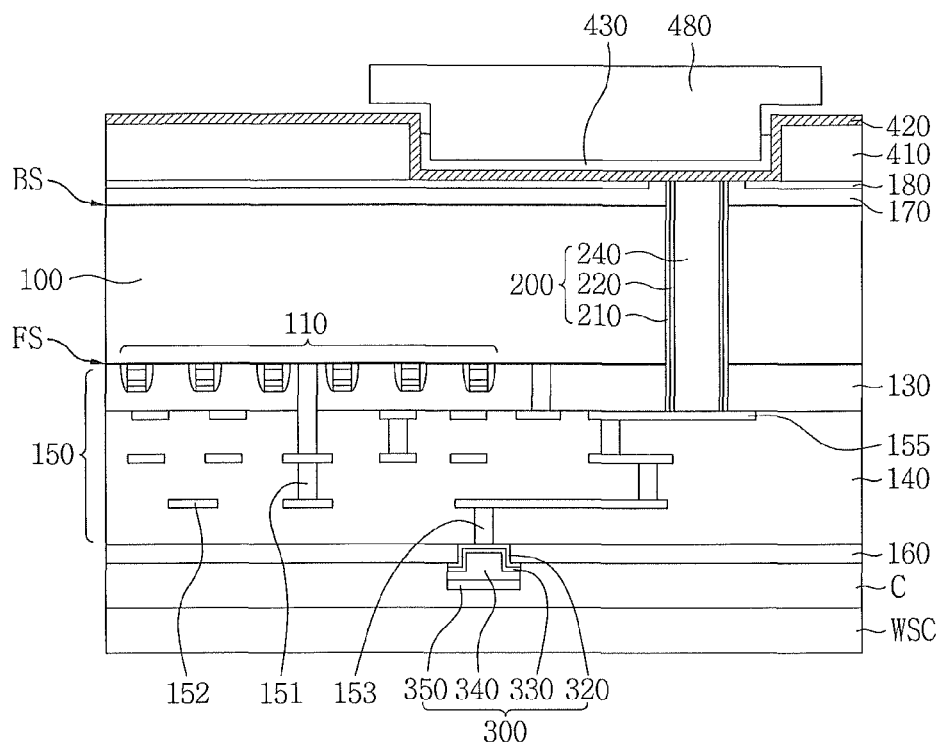
Figure 3J:
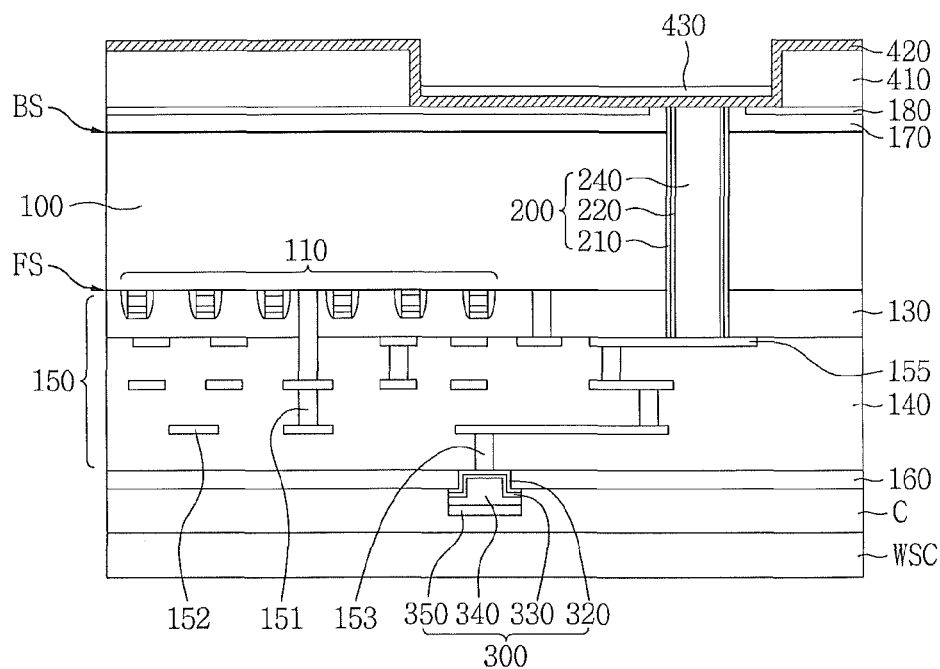
Figure 3K:
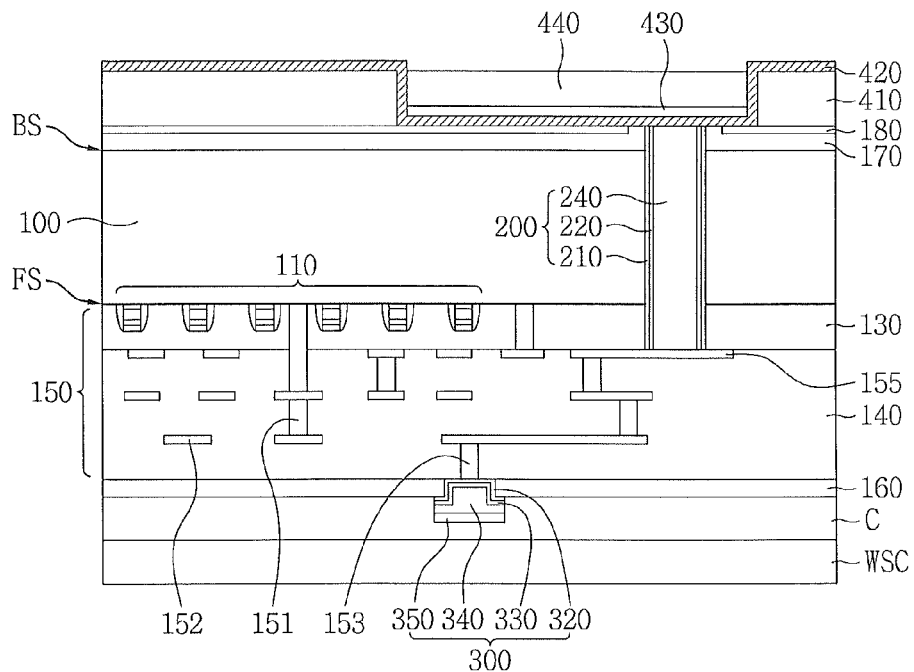
Figure 3L:
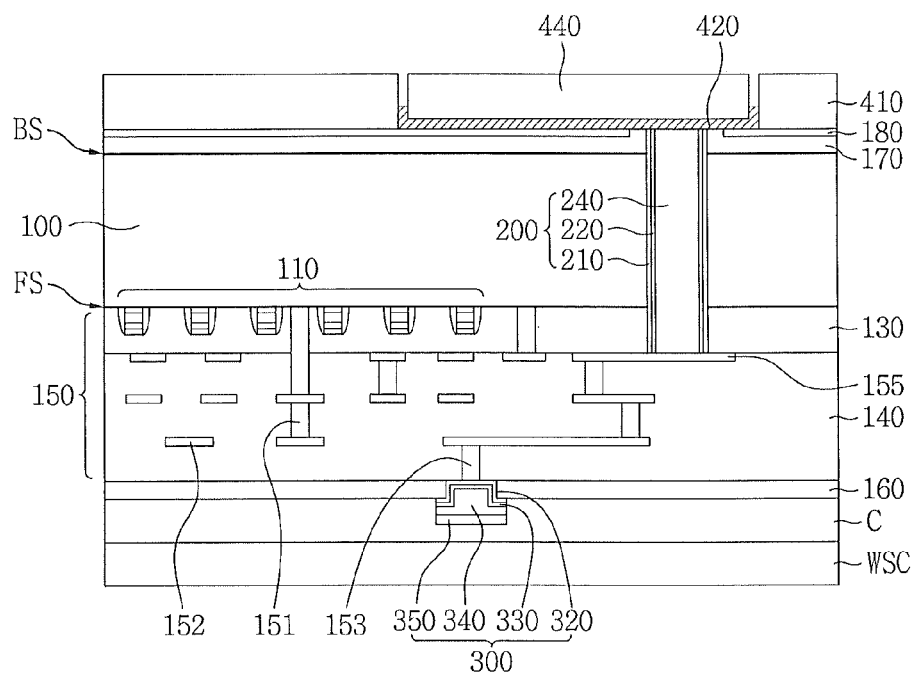
Figure 3M:
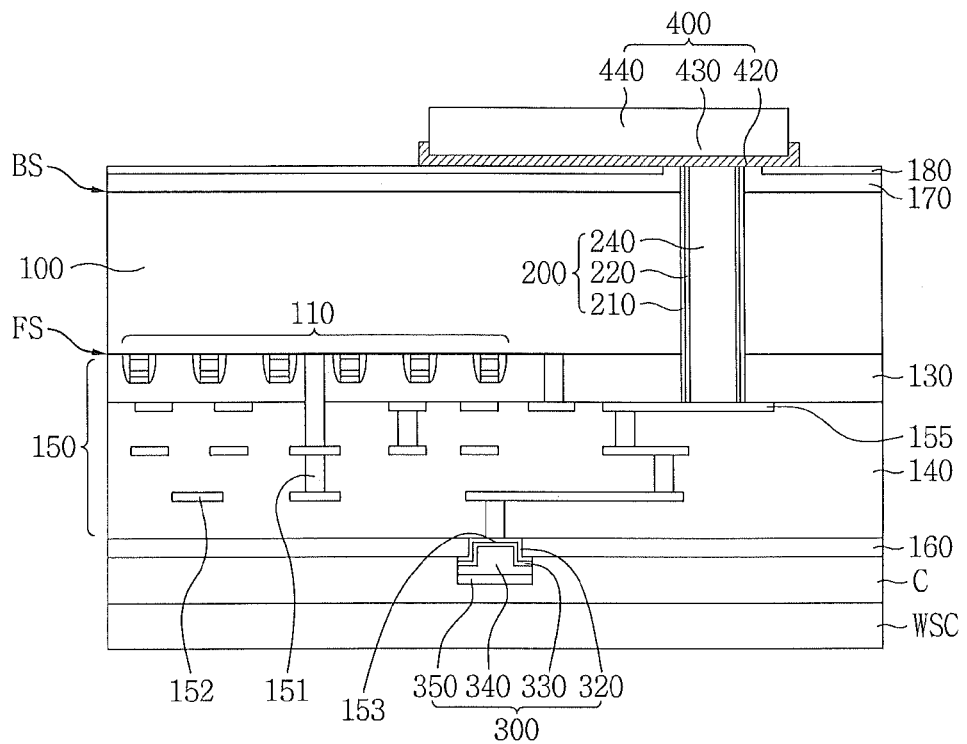
Figure 3N:
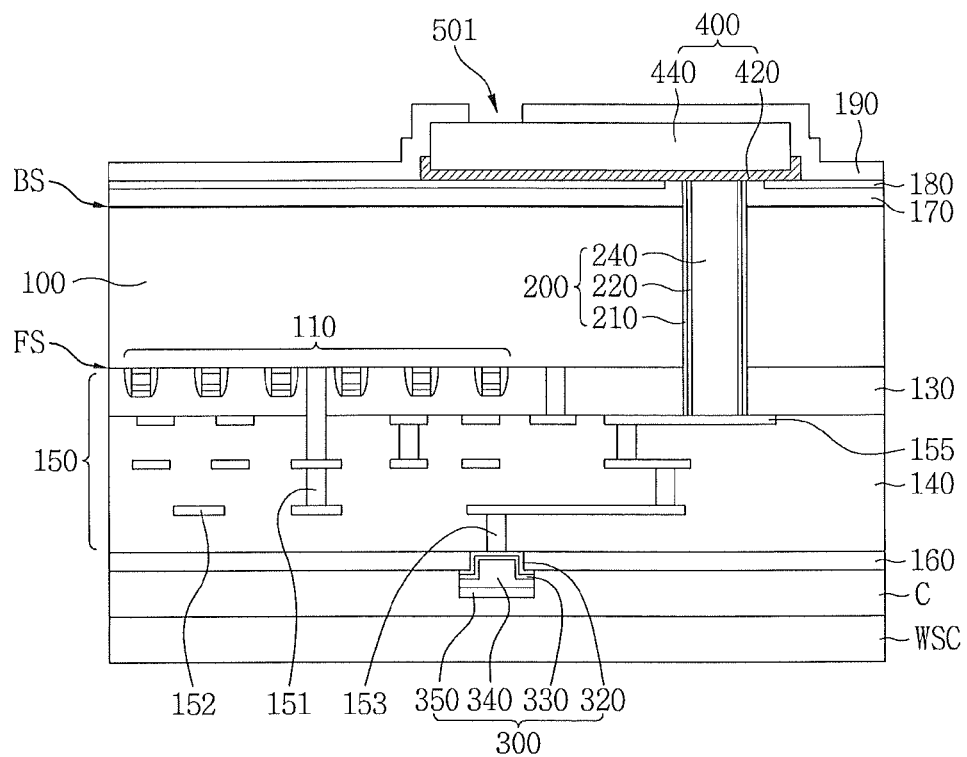

FIGS. 3A to 3N are cross-sectional views illustrating a method of forming a redistribution structure 400 of semiconductor devices 10A to 10I according to some embodiments of the inventive concept.

Referring to FIG. 3A, the method may include turning up the substrate 100 to be mounted on a wafer support carrier (WSC). A cushion layer C may be disposed on the WSC to protect the front pad 300 from physical impact.

Referring to FIG. 3B, the method may include exposing a back side end BE of the through via structure 200 by entirely and/or selectively removing the back side BS of the substrate 100. For example, a part of upper and sides of the back side end BE of the through via structure 200 may be exposed. The removal of the back side BS of the substrate 100 may include performing a grinding process and/or an etch-back process.

Referring to FIG. 3C, the method may include forming a lower back side insulating layer 170 and an upper back side insulating layer 180 covering the back side BS of the substrate 100 and the back side end BE of the through via structure 200. For example, the lower back side insulating layer 170 may include silicon oxide, and the upper back side insulating layer 180 may include silicon nitride.

Referring to FIG. 3D, the method may include exposing a through via core 240 of the through via structure 200. For example, exposing the through via core 240 may include a planarization process such as CMP. During this process, the through via liner 210 and the through via barrier layer 220 may be exposed. The lower back side insulating layer 170 surrounding the through via structure 200 may be exposed as well. During this process, the upper back side insulating layer 180 may be used as a stop layer of the CMP. In addition, the upper back side insulating layer 180 may remain. The exposed surface of the through via structure 200 and an upper surface of the upper back side insulating layer 180 may be disposed at an equal level.

Referring to FIG. 3E, the method may include forming a redistribution mask pattern 410 having a redistribution groove 401. For example, the redistribution groove 401 may expose an end of the through via structure 200. The redistribution mask pattern 410 may include silicon oxide, silicon nitride or an organic material such as photoresist. For example, when the redistribution mask pattern 410 is in contact with the upper back side insulating layer 180, the redistribution mask pattern 410 may include a different material from the upper back side insulating layer 180. In some embodiments, for example, when the upper back side insulating layer 180 is not formed, so that the redistribution mask pattern 410 is in contact with the lower back side insulating layer 170, the redistribution mask pattern 410 may include a different material from the lower back side insulating layer 170.

Referring to FIG. 3F, the method may include forming a redistribution barrier layer 420 and a redistribution seed layer 430 in the redistribution groove 401 and on the redistribution mask pattern 410. The redistribution barrier layer 420 may include, for example, Ti, TiN, TiW, Ta, TaN, WN, or other refractory metals. The redistribution seed layer 430 may include a metal for seed such as Cu, Ru, Ni and W.

Referring to FIG. 3G, the method may include forming a sacrificial layer 480 filling the redistribution groove 401. The sacrificial layer 480 may include silicon oxide, silicon nitride or an organic material such as photoresist. For example, after entirely forming the sacrificial layer 480, a photolithography process may be performed on the results.

Referring to FIG. 3H, the method may include partially removing the redistribution seed layer 430. The partial removal of the redistribution seed layer 430 may include performing a wet etching process using a chemical solution including a hydrogen peroxide, citric acid and water. The process may be understood as performing pull-back on the redistribution seed layer 430 between the sacrificial layer 480 and the redistribution barrier layer 420. During this process, for example, the redistribution seed layer 430 may remain only on a bottom surface of the redistribution groove 401. Referring to FIG. 3I, the method may include removing the redistribution seed layer 430 to partially remain on an inner wall of the redistribution groove 401.

Referring to FIG. 3J, the method may include removing the sacrificial layer 480. As a result of removing the sacrificial layer 480, the redistribution barrier layer 420 and the redistribution seed layer 430 may remain on the bottom surface of the redistribution groove 401 and the surface of the through via structure 200, and the redistribution barrier layer 420 may remain on inner walls of the redistribution groove 401 and the surface of the redistribution mask pattern 410.

Referring to FIG. 3K, the method may include forming a redistribution metal layer 440 in the redistribution groove 401. The redistribution metal layer 440 may be formed by performing a plating process using the redistribution seed layer 430 as a seed. The redistribution metal layer 440 may include the same material as or a different material from the redistribution seed layer 430. When the redistribution seed layer 430 and the redistribution metal layer 440 include the same material, a boundary therebetween may be not visible. Alternatively, when the redistribution seed layer 430 and the redistribution metal layer 440 include different materials, a boundary between the redistribution seed layer 430 and the redistribution metal layer 440 may be visible. In some embodiments, it is assumed that the redistribution seed layer 430 and the redistribution metal layer 440 include the same material, and thus a boundary therebetween may be omitted in the drawings below.

Referring to FIG. 3L, the method may include partially removing the redistribution barrier layer 420. The partial removal of the redistribution barrier layer 420 may include performing a wet etching process using a chemical solution including a hydrogen peroxide solution, potassium hydroxide (KOH) and water. This process may be understood to perform pull-back on the redistribution barrier layer 420 between the redistribution metal layer 440 and the redistribution mask pattern 410. During this process, for example, the process may be controlled such that the redistribution barrier layer 420 may remain partially on the inner walls of the redistribution groove 401.

As appreciated by the present inventors, when the redistribution barrier layer 420 is formed before forming the redistribution mask pattern 410 and then removed by a wet etch process after removing redistribution mask pattern 410, unless otherwise addressed, the sides of the redistribution barrier layer 420 may be etched by the wet etch process resulting in undercut portions under the redistribution barrier layer 420. The method described in FIG. 3L may reduce possibility of forming the undercut portions.

Referring to FIG. 3M, the method may include removing the redistribution mask pattern 410.

Referring to FIG. 3N, the method may include forming a back side passivation layer 190 covering the redistribution metal layer 440 and the redistribution barrier layer 420. The back side passivation layer 190 may have a lower opening 501 partially exposing the redistribution metal layer 440. In the subsequent process, the lower opening 501 may be used as an element constituting a back side pad 500.

Figure 4A:
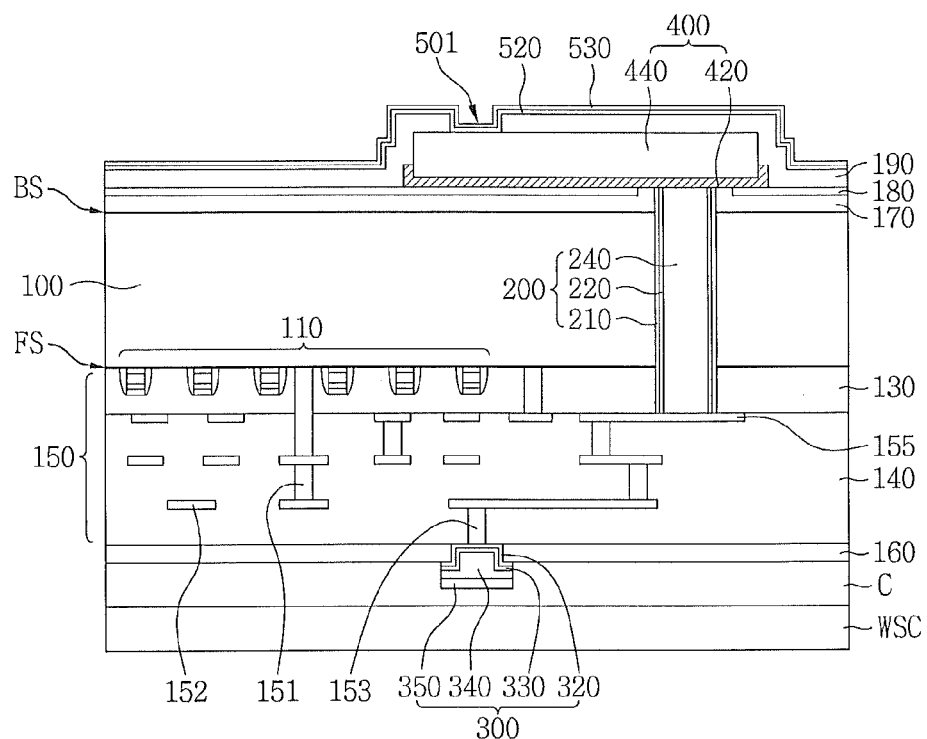
FIGS. 4A to 4C are cross-sectional views illustrating a method of forming a back side pad of semiconductor devices according to some embodiments of the inventive concept.
Figure 4B:
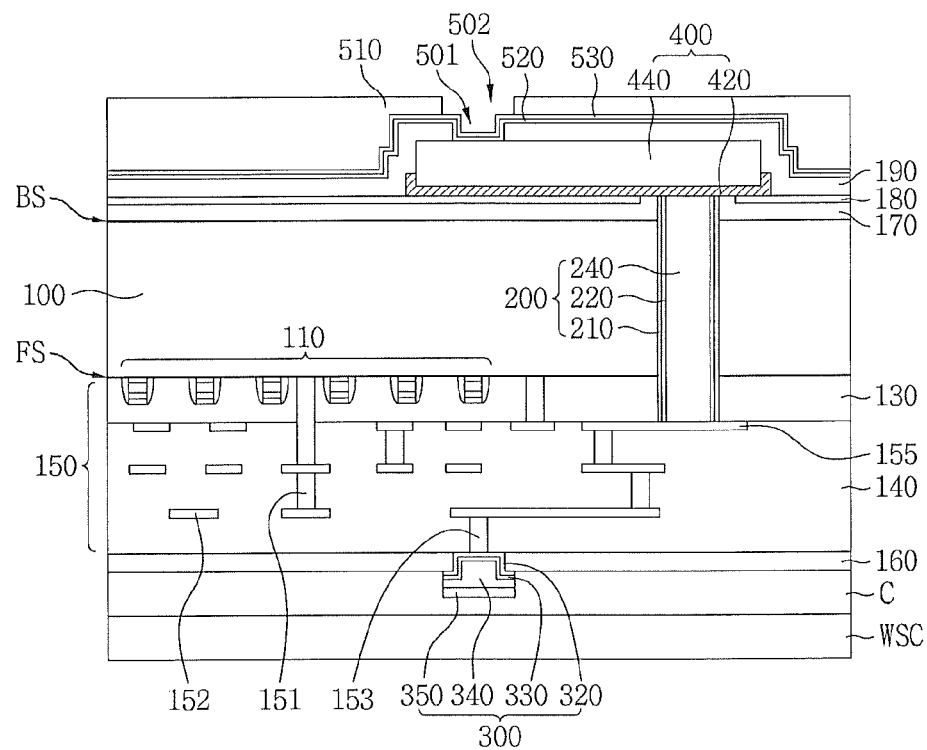
Figure 4C:
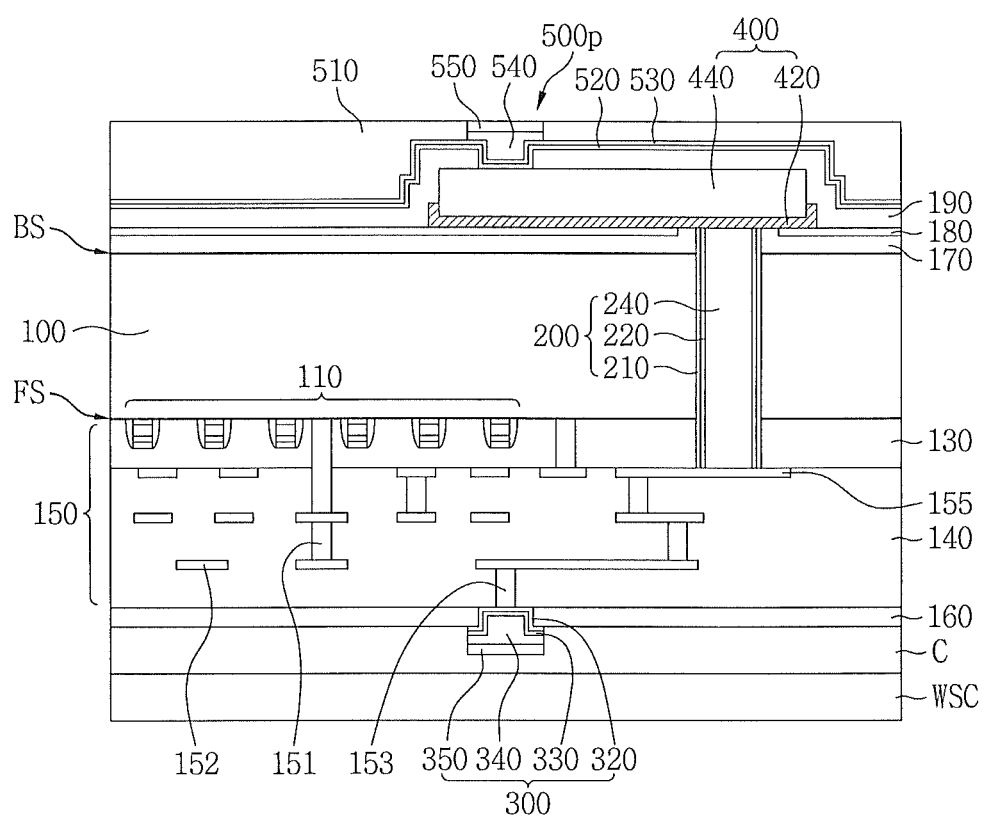

FIGS. 4A to 4C are cross-sectional views illustrating a method of forming a back side pad 500 of semiconductor devices 10A to 10I according to some embodiments of the inventive concept.

Referring to FIG. 4A, a method of fabricating a semiconductor device according to some embodiments of the inventive concept may include forming a back side pad barrier layer 520 and a back side pad seed layer 530 on the back side passivation layer 190 and the redistribution metal layer 440. The formation of the back side pad barrier layer 520 may include conformally forming a metal on the back side passivation layer 190 and the redistribution metal layer 440 using a PVD or MOCVD process. The back side pad barrier layer 520 may include, for example, Ti, TiN, TiW, Ta, TaN, WN, or other refractory metals. The back side pad barrier layer 520 may be formed as a single or multi-layer. The formation of the back side pad seed layer 530 may include conformally forming a metal such as Cu, Ru, Ni, and W on the back side pad barrier layer 520 using a PVD process such as sputtering, or a CVD process.

Referring to FIG. 4B, the method may include forming a back side pad mask pattern 510 on the back side pad seed layer 530. The back side pad mask pattern 510 may have an upper opening 502 aligned with the lower opening 501. The back side pad mask pattern 510 may include photoresist.

Referring to FIG. 4C, the method may include forming a preliminary back side pad 500p. The formation of the preliminary back side pad 500p may include forming a back side pad metal layer 540 and a back side pad capping layer 550 in the back side pad opening 501. The formation of the back side pad metal layer 540 may include forming a metal such as Ni or W using a plating process. The formation of the back side pad capping layer 550 may include plating Au, Ni or Ag on the back side pad metal layer 540.

Referring to FIG. 1A, the method may include forming a back side pad 500. The formation of the back side pad 500 may include removing the back side pad mask pattern 510, and partially removing the back side pad seed layer 530 and the back side pad barrier layer 520 exposed on the back side passivation layer 190 using a wet etching process. The removal of the back side pad seed layer 530 may include performing a wet etching process using a chemical solution including a hydrogen peroxide solution, citric acid, and water. The removal of the back side pad barrier layer 520 may include performing a wet etching process using a chemical solution including a hydrogen peroxide solution, potassium hydroxide (KOH), and water.

Figure 5A:
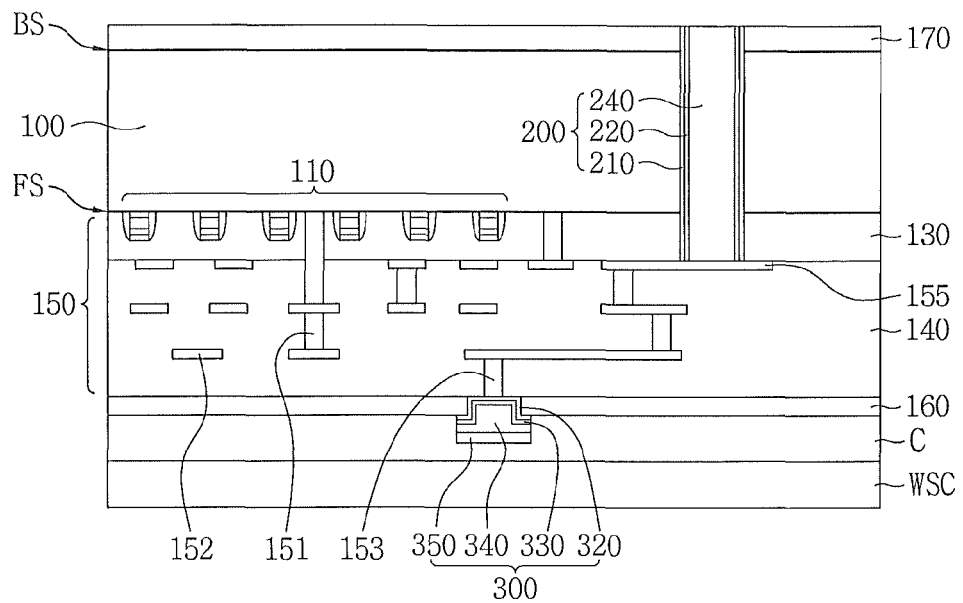
FIGS. 5A and 5B are cross-sectional views illustrating a method of forming a redistribution structure of semiconductor devices according to some embodiments of the inventive concept.
Figure 5B:
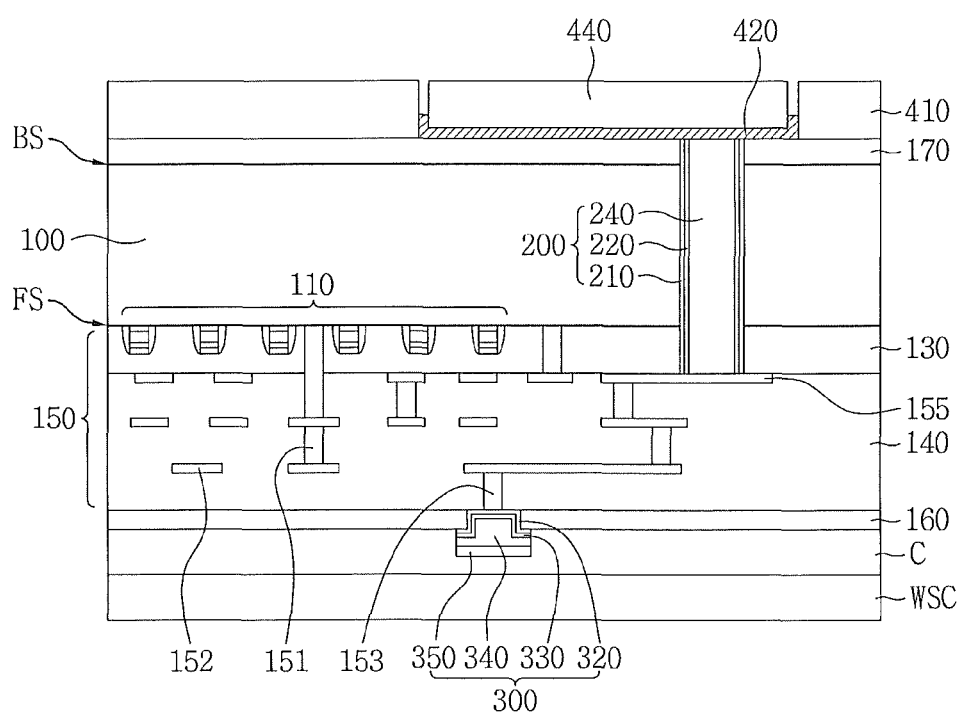

FIGS. 5A and 5B are cross-sectional views illustrating a method of forming a redistribution structure 400 of semiconductor devices 10A to 10I according to some embodiments of the inventive concept.

Referring to FIG. 5A, the method of fabricating a semiconductor device according to some embodiments of the inventive concept may include exposing a through via core 240 of a through via structure 200 after performing the processes described with reference to FIGS. 2A to 3C, and removing an upper back side insulating layer 180. For example, the CMP process may be performed to remove the upper back side insulating layer 180, and to expose a surface of a lower back side insulating layer 170. The exposed surface of the through via structure 200 and that of the lower back side insulating layer 170 may be disposed at an equal level.

Referring to FIG. 5B, the method may include performing the processes described with reference to FIGS. 3E and 3L, forming a redistribution mask pattern 410 having a redistribution groove 401, forming a redistribution barrier layer 420 and a redistribution seed layer 430 in the redistribution groove 401 and on the redistribution mask pattern 410, forming a sacrificial layer 480 filling the redistribution groove 401, partially removing the redistribution seed layer 430, removing the sacrificial layer 480, forming a redistribution metal layer 440 in the redistribution groove 401, and partially removing the redistribution barrier layer 420. The lower back side insulating layer 170 may be in direct contact with the redistribution barrier layer 420.

After performing the processes described with reference to FIGS. 3M to 4C, referring further to FIG. 1B, the method may include removing the back side pad mask pattern 510, and partially removing the back side pad seed layer 530 and the back side pad barrier layer 520 exposed on the back side passivation layer 190 using a wet etching process.

Figure 6:
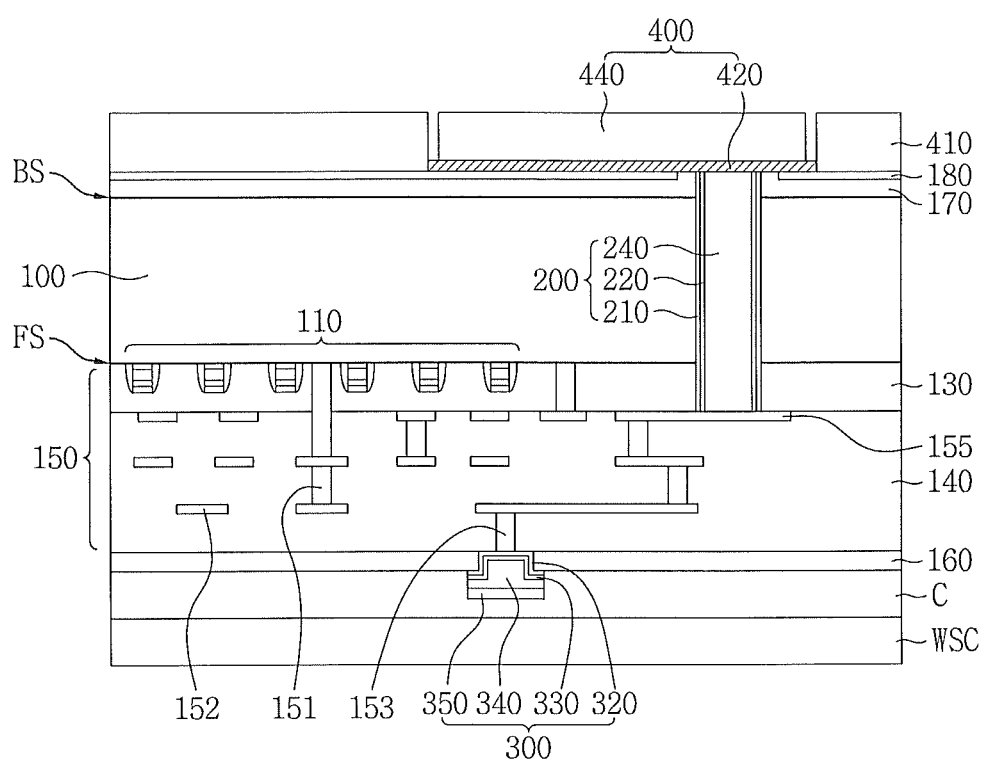
FIG. 6 is a cross-sectional view illustrating a method of forming a redistribution structure of semiconductor devices according to some embodiments of the inventive concept.

FIG. 6 is a cross-sectional view illustrating a method of forming a redistribution structure 400 of semiconductor devices 10A to 10I according to some embodiments of the inventive concept. Referring to FIG. 6, the method of forming the redistribution structure 400 of semiconductor devices 10A to 10I according to some embodiments of the inventive concept may include partially removing the redistribution barrier layer 420 after performing the processes described with reference to FIGS. 2A to 3K, wherein the redistribution barrier layer 420 is removed to sufficiently expose sides of the redistribution metal layer 440. For example, the redistribution barrier layer 420 may cover a bottom surface of the redistribution groove 401, and partially cover sidewalls of the redistribution groove 401. Side ends of the redistribution barrier layer 420 may horizontally protrude from the sides of the redistribution metal layer 440. Alternatively, the redistribution barrier layer 420 may not be in contact with a sidewall of the redistribution groove 401. Afterwards, after performing the processes described with reference to FIGS. 3M and 4C, referring further to FIG. 1C, the method may include removing the back side pad mask pattern 510, and partially removing the back side pad seed layer 530 and the back side pad barrier layer 520 exposed on the back side passivation layer 190 using a wet etching process.

Additionally, it may be understood that as a result of performing the processes described with reference to FIGS. 5A and 6, the redistribution structure 400 of the semiconductor device 10D illustrated in FIG. 1D may be formed.

Figure 7A:
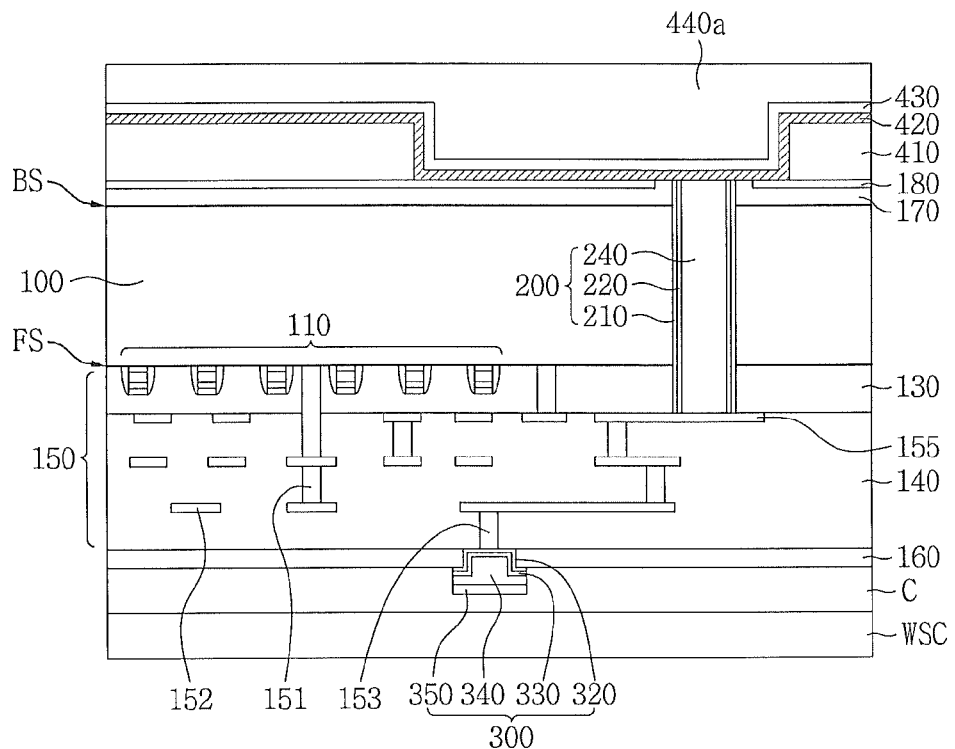
FIGS. 7A to 7C are cross-sectional views illustrating a method of forming a redistribution structure of semiconductor devices according to some embodiments of the inventive concept.
Figure 7B:
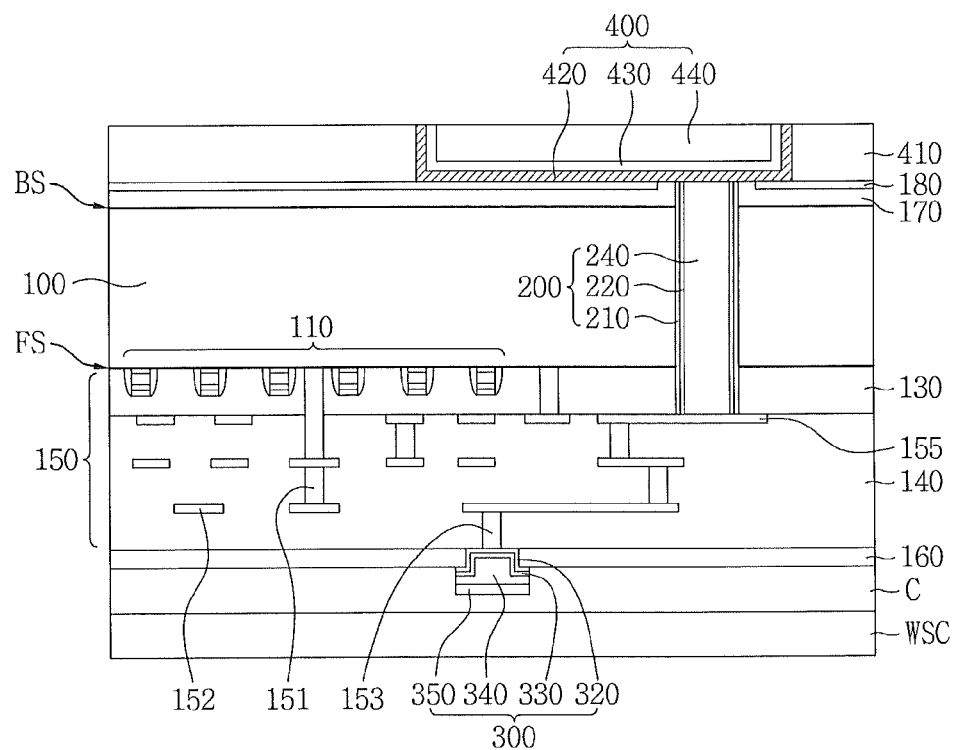
Figure 7C:
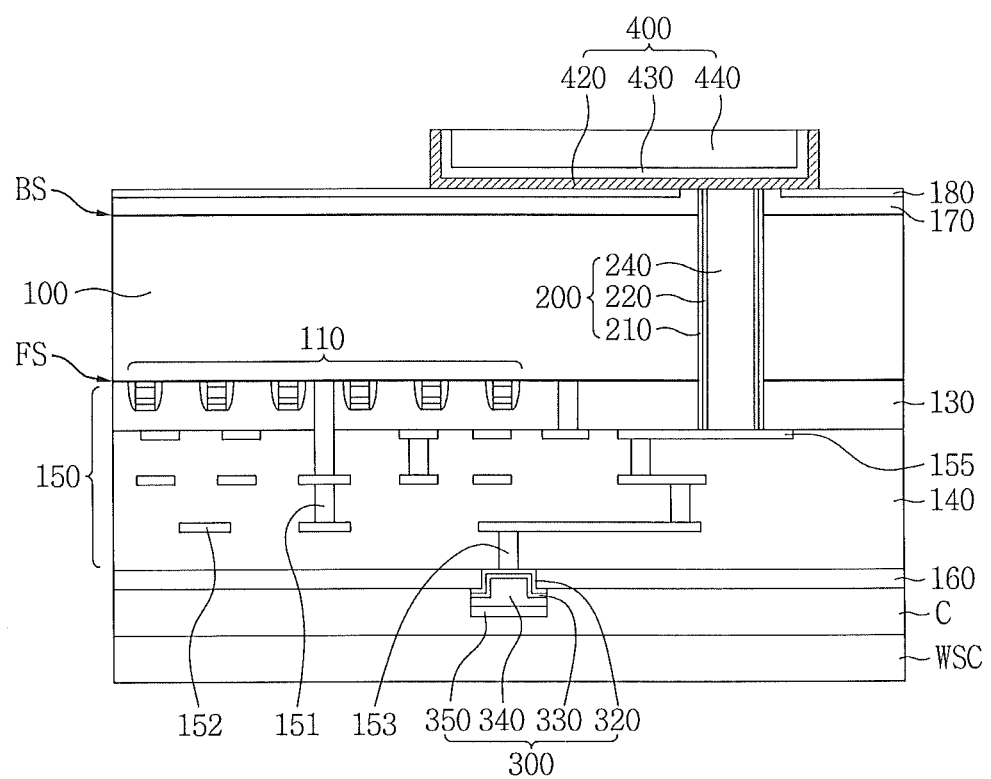

FIGS. 7A to 7C are cross-sectional views illustrating a method of forming a redistribution structure 400 of semiconductor devices 10A to 10I according to some embodiments of the inventive concept.

Referring to FIG. 7A, the method of forming the redistribution structure 400 of the semiconductor devices 10A to 10I according to some embodiments of the inventive concept may include forming a redistribution metal material layer 440a on the redistribution seed layer 430 after performing the processes described with reference to FIGS. 2A to 3F.

Referring to FIG. 7B, the method may include removing upper parts of the redistribution metal material layer 440a, the redistribution seed layer 430 and the redistribution barrier layer 420 to form the redistribution structure 400. The removal of the redistribution metal material layer 440a may include performing a CMP process. The removal of the redistribution seed layer 430 and the redistribution barrier layer 420 may include performing a CMP process and/or a wet etching process.

Referring to FIG. 7C, the method may include removing the redistribution mask pattern 410. Then, after performing the processes described with reference to FIGS. 3N to 5B, referring further to FIG. 1E, the method may include removing the back side pad mask pattern 510, and partially removing the back side pad seed layer 530 and the back side pad barrier layer 520 exposed on the back side passivation layer 190 using a wet etching process.

Additionally, it may be understood that as a result of performing the processes described with reference to FIG. 6 and/or FIGS. 3N to 4C, the redistribution structure 400 of the semiconductor device 10F illustrated in FIG. 1F may be formed.

Figure 8A:
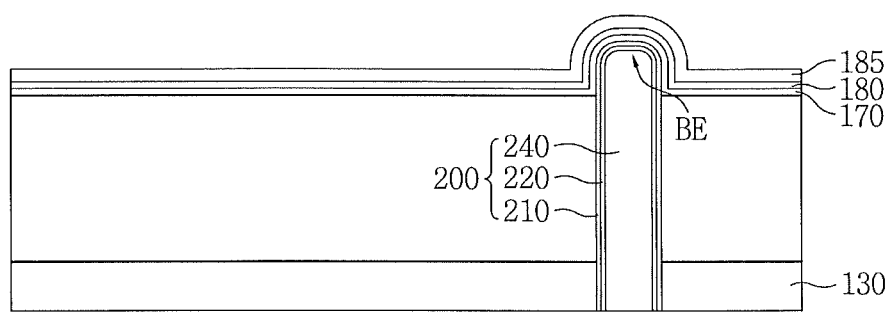
FIGS. 8A and 8B are cross-sectional views illustrating a method of forming a redistribution structure of semiconductor devices according to some embodiments of the inventive concept.
Figure 8B:
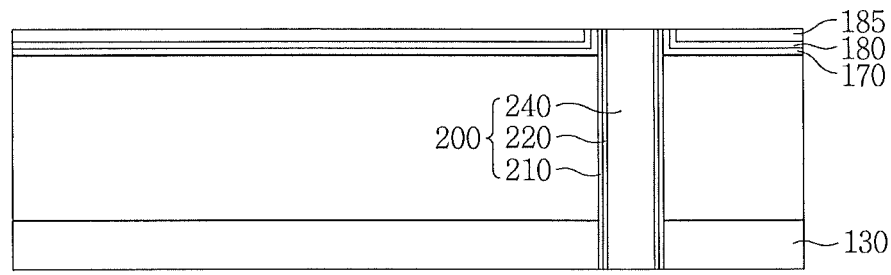

FIGS. 8A and 8B are cross-sectional views illustrating a method of fabricating a redistribution structure of semiconductor devices according to some embodiments of the inventive concept.

Referring to FIG. 8A, the method of fabricating a semiconductor device according to some embodiments of the inventive concept may include forming the lower back side insulating layer 170, the upper back side insulating layer 180 and the uppermost back side insulating layer 185 on the back side BS of a substrate 100 to surround the exposed through via structure 200 after performing the processes described with reference to FIGS. 2A to 3B. The lower back side insulating layer 170 and the uppermost back side insulating layer 185 may include silicon oxide, and the upper back side insulating layer 180 may include silicon nitride.

Referring to FIG. 8B, the method may include exposing a back side end BE of the through via structure 200. For example, the method may include performing the CMP process to expose a through via core 240 of the through via structure 200. Then, the processes described with reference to FIGS. 3A to 7C may be performed to fabricate the semiconductor devices 10G, 10H, and 10I illustrated in FIGS. 1G to 1I.

Figure 9A:
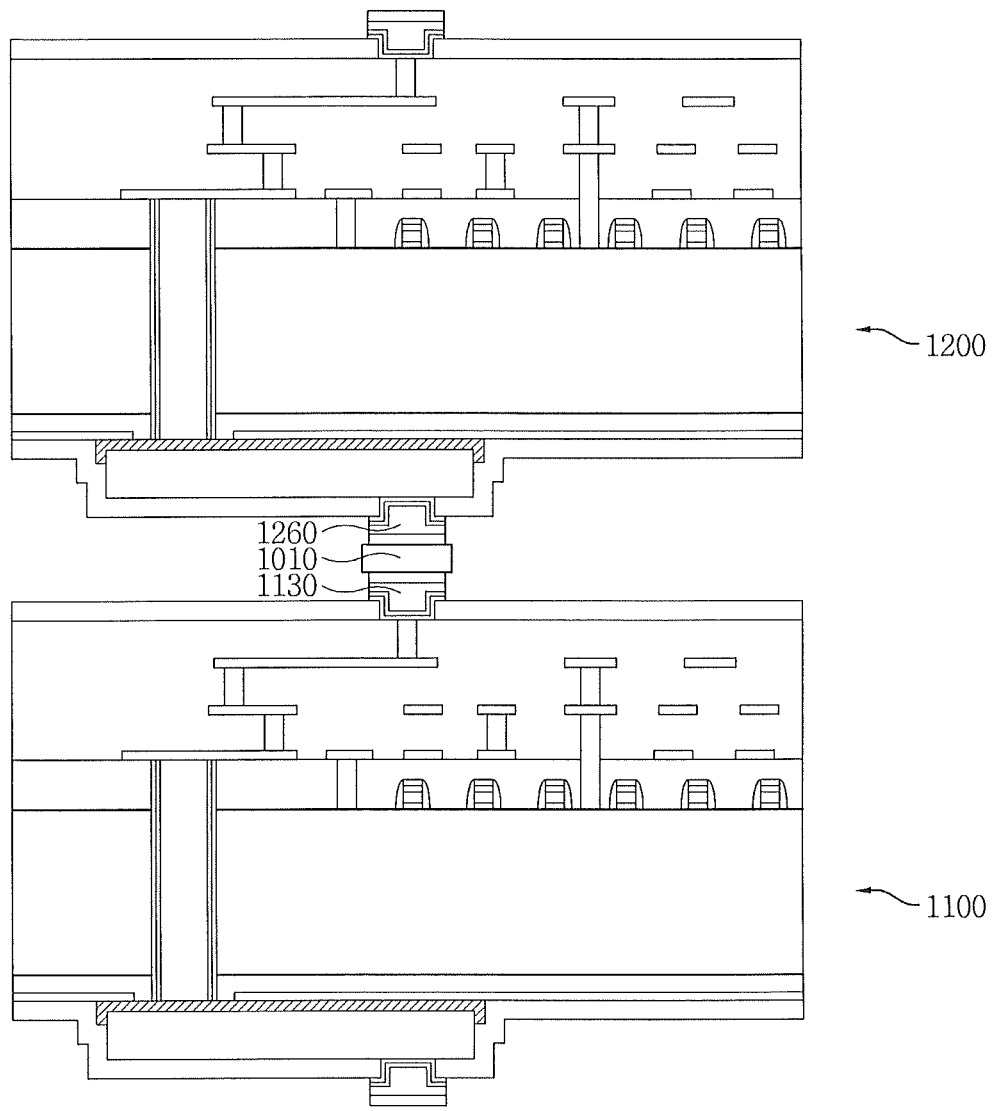
FIGS. 9A and 9B are schematic cross-sectional views of semiconductor device stacked structures according to some embodiments of the inventive concept.
Figure 9B:
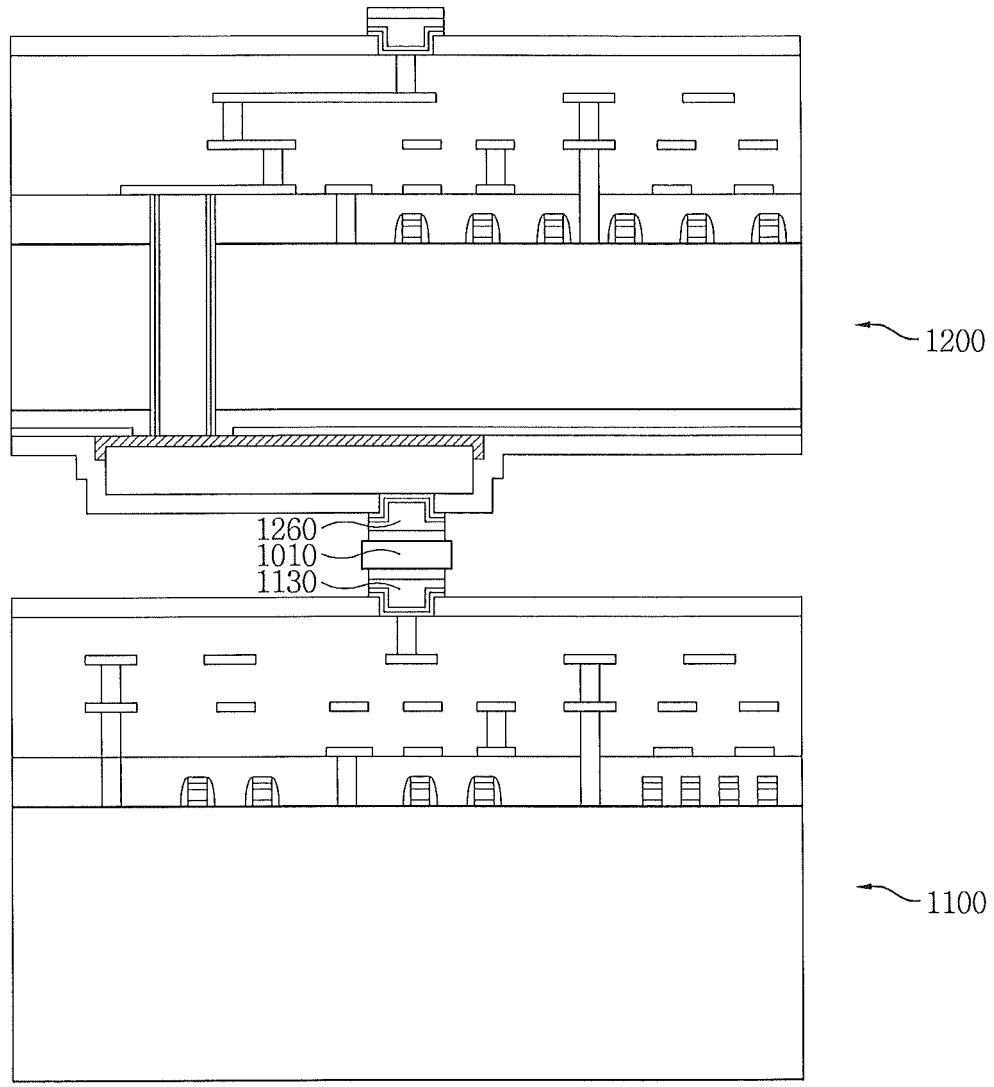

FIGS. 9A and 9B are schematic cross-sectional views of semiconductor device stacked structures 1000A and 1000B according to some embodiments of the inventive concept.

Referring to FIG. 9A, the semiconductor device stacked structure 1000A according to some embodiments of the inventive concept may include a lower semiconductor device 1100 and an upper semiconductor device 1200. A front side pad 1130 of the lower semiconductor device 1100 may be electrically connected to a back side pad 1260 of the upper semiconductor device 1200 using a bump 1010. For example, the semiconductor device stacked structure 1000A in which the front side pad 1130 of the lower semiconductor device 1100 is electrically connected to the back side pad 1260 of the upper semiconductor device 1200, may be formed. The bump 1010 may include a solder material. For example, the bump may include tin (Sn), Au, and Cu. The bump 1010 may further include Ni. The lower semiconductor device 1100 may be the same as the upper semiconductor device 1200. For example, the front side pad 1130 may be vertically aligned with the back side pad 1260.

Referring to FIG. 9B, the semiconductor device stacked structure 1000B according to some embodiments of the inventive concept may include a lower semiconductor device 1100 and an upper semiconductor device 1200. For example, the lower semiconductor device 1100 may include a logic device, and the upper semiconductor device 1200 may include a memory device. For example, a front side pad 1130 of the lower semiconductor device 1100 may be physically and/or electrically connected to a back side pad 1260 of the upper semiconductor device 1200 through the bump 1010.

Figure 10A:
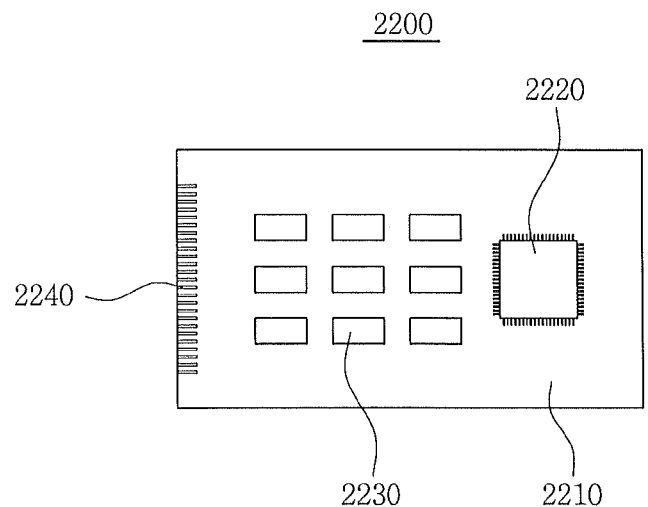
FIG. 10A is a diagram illustrating an example of a semiconductor module including at least one of semiconductor devices according to some embodiments of the inventive concept.

FIG. 10A is a diagram illustrating an example of a semiconductor module 2200 including at least one of semiconductor devices according to some embodiments of the inventive concept. Referring to FIG. 10A, the semiconductor module 2200 according to some embodiments of the inventive concept may include the semiconductor devices 2230 according to some embodiments of the inventive concept mounted on the semiconductor module substrate 2210. The semiconductor module 2200 may further include a microprocessor 2220 mounted on the module substrate 2210. Input/output terminals 2240 may be disposed around at least one side of the module substrate 2210.

Figure 10B:
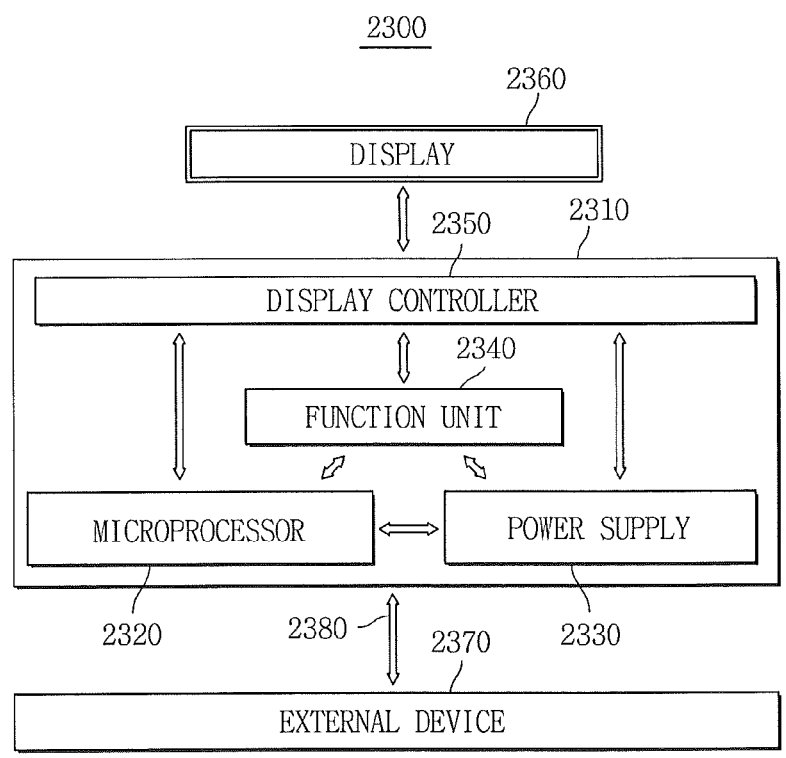
FIG. 10B is a block diagram illustrating an example of an electronic system including at least one of the semiconductor devices according to some embodiments of the inventive concept.

FIG. 10B is a block diagram illustrating an example of an electronic system 2300 including at least one of the semiconductor devices according to some embodiments of the inventive concept. Referring to FIG. 10B, the semiconductor devices according to some embodiments of the inventive concept may be applied to the electronic system 2300. The electronic system 2300 may include a body 2310. The body 2310 may include a microprocessor 2320, a power supply 2330, a function unit 2340, and/or a display controller 2350. The body 2310 may be a system board or mother board formed of a PCB or the like. The microprocessor 2320, the power supply 2330, the function unit 2340 and the display controller 2350 may be mounted or installed on the body 2310.

For example, the display unit 2360 may be disposed on a surface of the body 2310 to display an image processed by the display controller 2350. The power supply 2330 is supplied with a predetermined voltage from an external power supply, and divides the voltage into a required voltage level to supply to the microprocessor 2320, the function unit 2340 and the display controller 2350. The microprocessor 2320 may be supplied with a voltage from the power supply 2330 to control the functional unit 2340 and the display unit 2360. The function unit 2340 may perform various functions of the electronic system 2300.

For example, when the electronic device 2300 is a cellular phone, the functional unit 2340 may include various components capable of functioning as a cellular phone such as dialing, outputting an image on the display unit 2360 as a result of communication with an external apparatus 2370, and outputting voice through a speaker. Furthermore, when the external apparatus 2370 includes a camera, the function unit 2340 may function as an image processor. In other embodiments, when the electronic system 2300 is connected to a memory card for capacity expansion, the function unit 2340 may be a memory card controller. The function unit 2340 may transmit or receive a signal to or from the external apparatus 2370 via a wired or wireless communication unit 2380. Moreover, when the electronic system 2300 requires a universal serial bus (USB) for function expansion, the functional unit 2340 may function as a boundary controller. The semiconductor devices according to some embodiments of the inventive concept may be included in at least one of the microprocessor 2320 and the function unit 2340.

Figure 10C:
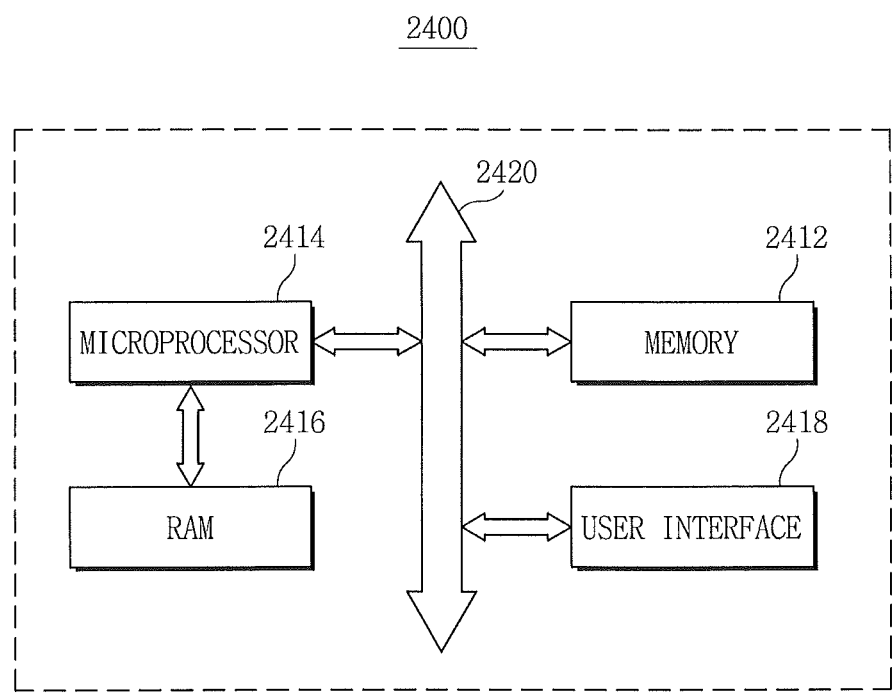
FIG. 10C is a block diagram illustrating an example of an electronic system having at least one of semiconductor devices according to some embodiments of the inventive concept.

FIG. 10C is a block diagram illustrating an example of an electronic system 2400 including at least one of semiconductor devices according to some embodiments of the inventive concept. Referring to FIG. 10C, an electronic system 2400 may include at least one of semiconductor devices according to some embodiments of the inventive concept. The electronic system 2400 may be used in the fabrication of a mobile device or computer. For example, the electronic system 2400 may include a user interface 2418 performing data communication using a memory system 2412, a microprocessor 2414, a RAM 2416, and a bus 2420. The microprocessor 2414 may program or control the electronic system 2400. The RAM 2416 may be used as an operation memory of the microprocessor 2414. For example, the microprocessor 2414 or RAM 2416 may include at least one of semiconductor devices according to some embodiments of the inventive concept. The microprocessor 2414, the RAM 2416 and/or the other components may be assembled in a single package. The user interface 2418 may be used in inputting data into the electronic system 2400, or outputting data from the electronic system 2400. A memory system 2412 may store codes for operating the microprocessor 2414, data processed by the microprocessor 2414, or externally input data. The microprocessor 2414 may include a controller and a memory.

Figure 10D:
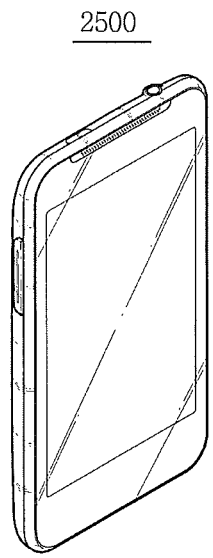
FIG. 10D is a schematic view illustrating an example of a mobile device including at least one of semiconductor devices according to some embodiments of the inventive concept.

FIG. 10D is a schematic view illustrating an example of a mobile device 2500 including at least one of semiconductor devices according to some embodiments of the inventive concept. The mobile device 2500 may include a mobile phone or tablet PC. In addition, at least one of the semiconductor devices according to some embodiments of the inventive concept may be used for a portable computer such as a notebook, an mpeg-1 audio layer 3 (MP3) player, an MP4 player, a navigation device, a solid state disk (SSD), a desktop computer, an automobile, and an electric appliance in addition to a mobile phone or tablet PC.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
    internal circuits on a first side of a substrate;
    a through via structure vertically penetrating the substrate to be electrically connected to one of the internal circuits;
    a redistribution structure on a second side of the substrate opposite the first side of the substrate and electrically connected to the through via structure;
    an insulating layer between the second side of the substrate and the redistribution structure, wherein the redistribution structure includes a redistribution barrier layer and a redistribution metal layer, and the redistribution barrier layer extends on a bottom surface of the redistribution metal layer and partially surrounds a side of the redistribution metal layer; and
    a passivation layer conformally covering sides and an upper surface of the redistribution structure and an upper surface of the insulating layer.

2. The device of claim 1, wherein the redistribution barrier layer surrounds a lower portion of the side of the redistribution metal layer while exposing an upper portion of the side of the redistribution metal layer.

3. The device of claim 1, wherein the insulating layer includes:
a lower insulating layer in contact with the second side of substrate; and
an upper insulating layer on the lower insulating layer.

4. The device of claim 3, wherein the lower insulating layer is in contact with a side of the through via structure, and the upper insulating layer is free of contact with the side of the through via structure.

5. The device of claim 4, wherein a vertical portion of the lower insulating layer extends between the side of the through via structure and the upper insulating layer.

6. The device of claim 4, wherein the lower insulating layer includes silicon oxide and the upper insulating layer includes silicon nitride.

7. The device of claim 1, wherein a portion of the through via structure protrudes from the second side of the substrate, and the insulating layer surrounds the portion of the through via structure.

8. The device of claim 1, further comprising a pad on the passivation layer to be electrically connected to the redistribution structure.

9. The device of claim 8, wherein the pad includes:
a pad barrier layer in direct contact with the redistribution structure; and
a pad metal layer on the pad barrier layer.

10. The device of claim 1, wherein the through via structure includes:
a through via core;
a through via barrier layer surrounding a side of the through via core; and
a through via liner surrounding a side of the through via barrier layer, wherein the through via core is in direct contact with the redistribution structure and the one of the internal circuits.

11. A semiconductor device, comprising:
internal circuits on a first side of a substrate;
a through via structure vertically penetrating the substrate to be electrically connected to one of the internal circuits, wherein a portion of the through via structure protrudes from a second side of the substrate opposite the first side of the substrate;
a lower insulating layer on the second side of the substrate, the lower insulating layer surrounding a side of the portion of the through via structure;
an upper insulating layer on the lower insulating layer;
an uppermost insulating layer on the upper insulating layer; and
a redistribution structure on the uppermost insulating layer and electrically connected to the through via structure, wherein the redistribution structure includes a redistribution barrier layer in direct contact with the through via structure and a redistribution metal layer on the redistribution barrier layer,
wherein the redistribution barrier layer exposes an upper portion of a side of the redistribution metal layer and surrounds a lower portion of the side of the redistribution metal layer.

12. The device of claim 11, wherein the lower insulating layer and the uppermost insulating layer include silicon oxide and the upper insulating layer includes silicon nitride.

13. The device of claim 11, wherein a vertical portion of the lower insulating layer extends between the side of the portion of the through via structure and the upper insulating layer, and a vertical portion of the upper insulating layer extends between the vertical portion of the lower insulating layer and the uppermost insulating layer.

14. An integrated circuit device, comprising:
a redistribution structure on a substrate;
an insulating layer extending between the substrate and the redistribution structure;
a through via structure penetrating through the substrate and the insulating layer, wherein the redistribution structure comprises a barrier layer contacting the through via structure and a metal layer on the harrier layer, and a width of the barrier layer is greater than a width of the metal layer when viewed in cross-section such that the metal layer is disposed within the barrier layer; and
a passivation layer conformally extending on sides and an upper surface of the redistribution structure and an upper surface of the insulating layer.

15. The integrated circuit device of claim 14, wherein the barrier layer contacts at least a portion of a side of the metal layer.

16. The integrated circuit device of claim 14, wherein the insulating layer comprises a first insulating layer comprising silicon oxide and a second insulating layer comprising silicon nitride.

17. The integrated circuit device of claim 16, wherein the first insulating layer contacts the substrate and a side of the through via structure.

18. The integrated circuit device of claim 14, wherein the metal layer comprises a seed layer contacting the barrier layer and the seed layer is disposed within the barrier layer when viewed in cross-section.

19. The device of claim 14, wherein the barrier layer exposes upper portions of sides of the metal layer and surrounds lower portions of the sides of the metal layer.

20. The device of claim 19, wherein the passivation layer contacts the upper portions of the sides of the metal layer that are exposed by the barrier layer.

* * * * *